United States Patent
Tsunetomo et al.

(10) Patent No.: US 6,901,095 B2
(45) Date of Patent: May 31, 2005

(54) SEMICONDUCTOR LASER MODULE, OPTICAL MEASURING METHOD AND OPTICAL MEASURING APPARATUS

(75) Inventors: Kohei Tsunetomo, Tokyo (JP); Naoki Tsukiji, Tokyo (JP); Junji Yoshida, Tokyo (JP); Naoki Hayamizu, Tokyo (JP); Takashi Koseki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 98 days.

(21) Appl. No.: 10/193,232

(22) Filed: Jul. 12, 2002

(65) Prior Publication Data

US 2003/0021311 A1 Jan. 30, 2003

(30) Foreign Application Priority Data

Jul. 25, 2001 (JP) ........................................ 2001-224911
May 13, 2002 (JP) ........................................ 2002-137457

(51) Int. Cl.[7] ................................................ H01S 5/00
(52) U.S. Cl. ...................................................... 372/43
(58) Field of Search ................................ 372/43, 36, 59

(56) References Cited

U.S. PATENT DOCUMENTS

| | | | | |
|---|---|---|---|---|
| 4,803,689 A | * | 2/1989 | Shibanuma | 372/36 |
| 4,947,261 A | * | 8/1990 | Ishikawa et al. | 358/473 |
| 5,140,384 A | * | 8/1992 | Tanaka | 257/36 |
| 5,402,435 A | * | 3/1995 | Shiono et al. | 372/43 |
| 5,440,575 A | * | 8/1995 | Chand et al. | 372/49 |
| 5,606,264 A | * | 2/1997 | Licari et al. | 324/763 |
| 5,696,785 A | | 12/1997 | Bartholomew et al. | |
| 5,770,473 A | | 6/1998 | Hall et al. | |
| 5,802,091 A | * | 9/1998 | Chakrabarti et al. | 372/49 |
| 5,872,881 A | * | 2/1999 | Rossi et al. | 385/92 |
| 5,878,069 A | * | 3/1999 | Kamibayashi et al. | 372/36 |
| 6,074,104 A | * | 6/2000 | Higashikawa | 385/94 |
| 6,112,002 A | * | 8/2000 | Tabuchi | 385/50 |
| 6,388,264 B1 | * | 5/2002 | Pace | 250/551 |
| 6,396,023 B1 | * | 5/2002 | Aikiyo | 219/117.1 |
| 6,459,710 B1 | * | 10/2002 | Whitney et al. | 372/29.02 |
| 6,542,534 B1 | * | 4/2003 | Svilans | 372/92 |

FOREIGN PATENT DOCUMENTS

| | | |
|---|---|---|
| EP | 1 022 781 | 7/2000 |
| JP | 60-186076 | 9/1985 |
| JP | 63-171802 | 7/1988 |
| JP | 01-215909 | 8/1989 |
| JP | 08-236660 | 9/1996 |

OTHER PUBLICATIONS

U.S. Appl. No. 09/486,727, filed Mar. 9, 2000.

* cited by examiner

*Primary Examiner*—Minsun Oh Harvey
*Assistant Examiner*—James Menefee
(74) *Attorney, Agent, or Firm*—Oblon, Spivak, McClelland, Maier & Neustadt, P.C.

(57) ABSTRACT

A package accommodates an LD device for emitting laser light with the center wavelength of which is in a range of 1300 to 1440 nm and airtight seals a light path extending from the LD device to an incident end of an optical fiber. The package is filled with a nitrogen gas at a standard atmospheric pressure with the amount of moisture limited to a value lower than 100000 ppm by volume or less. Therefore, the amount of moisture in the light path for laser light within the package is limited to 100000 ppm by volume or less.

30 Claims, 20 Drawing Sheets

TEMPERATURE: 25 °C, RELATIVE HUMIDITY: 85%

TEMPERATURE: 40 °C, RELATIVE HUMIDITY: 85%

TEMPERATURE: 75°C, RELATIVE HUMIDITY: 85%

TEMPERATURE: 85°C, RELATIVE HUMIDITY: 85%

FIG. 20
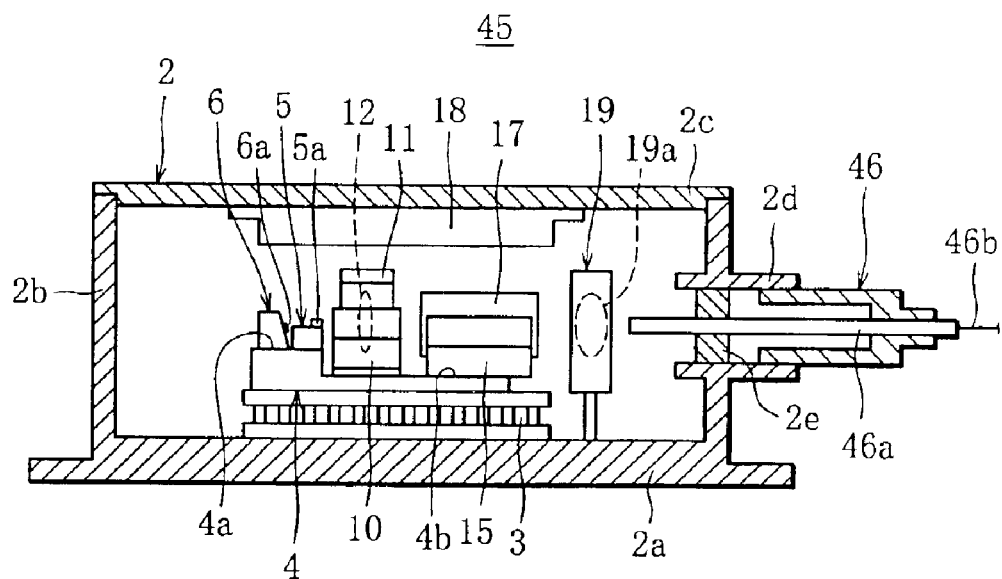
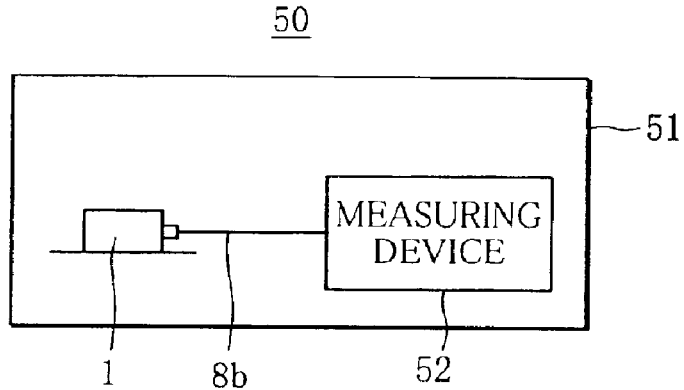
FIG. 22A
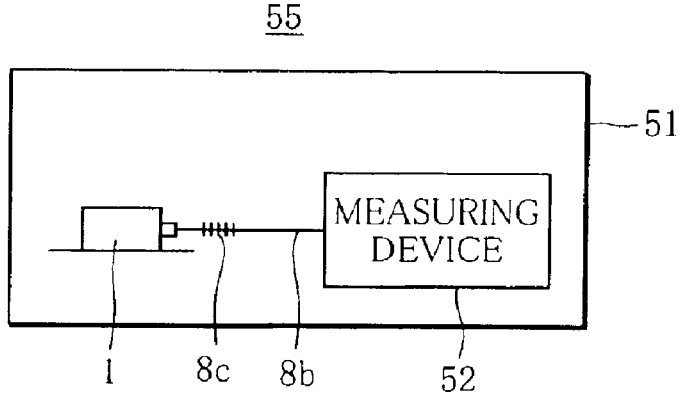
FIG. 22B

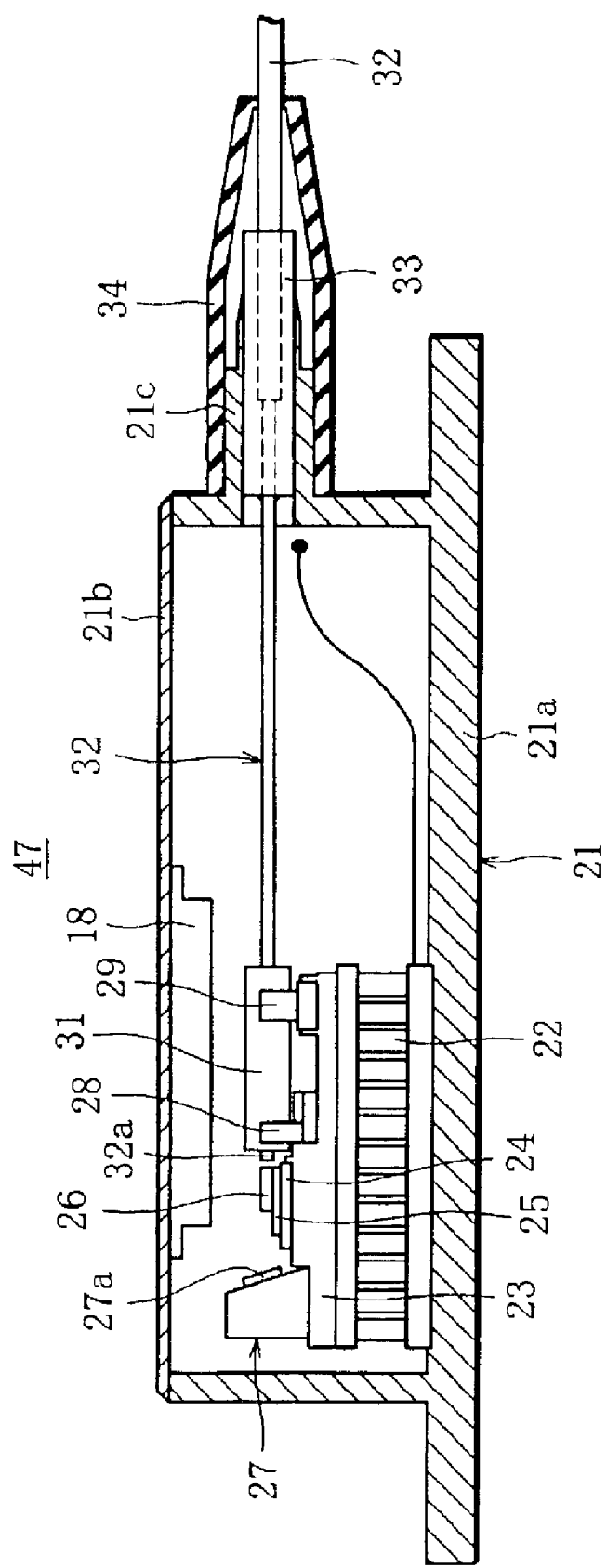

SEMICONDUCTOR LASER MODULE, OPTICAL MEASURING METHOD AND OPTICAL MEASURING APPARATUS

BACKGROUND OF THE INVENTION

1. Field of the Invention

The present invention relates to a semiconductor laser module, an optical measuring method and an optical measuring apparatus, and more particularly, to a semiconductor laser module for emitting laser light with the center wavelength in a range of 1300 to 1440 nm, and an optical measuring method and an optical measuring apparatus for measuring characteristics of laser light with the center wavelength in a range of 1300 to 1440 nm.

2. Description of the Related Art

In recent years, with the establishment of Raman amplification technology, a Raman amplifier which uses a pumping light source which emits a laser light at wavelength of around 1400 nm has entered into practice. The Raman amplifier employs a semiconductor laser module (hereinafter called the "LD module") as a pumping light source, which has a semiconductor laser device (hereinafter called the "LD device") encapsulated in a package.

However, it has been found that when laser light, for example, in a wavelength band of 1300 to 1440 nm is output from an LD module, a difference exists in the stability of laser oscillation depending on the center wavelength. For example, in a relationship between a driving current value and a quantum efficiency (derived by differentiating the light power of the LD device by the driving current value) representing the stability of oscillating state of the laser light from the LD device, kinks were found on a characteristic curve representing the relationship. Here, the term "kink" is a nonlinear portion which does not change continuously. In this way, the laser light from the LD module exhibited unstable characteristics in some cases.

It has been also revealed that measurements of laser light in a wavelength band of 1300 to 1440 nm may provide different results depending on the center wavelength. For example, in some cases, kinks were found on a characteristic curve representative of the quantum efficiency characteristic. In this way, the optical characteristics of laser light are not precisely measured at all times.

SUMMARY OF THE INVENTION

It is an object of the present invention to provide a semiconductor laser module for outputting laser light with the center wavelength in a range of 1300 to 1440 nm, which ensures a stable oscillating state of the laser light from an LD device used therein. It is another object of the present invention to provide an optical measuring method and an optical measuring apparatus, which are capable of precisely measuring optical characteristics of laser light to be measured, the center wavelength of which is in a range of 1300 to 1440 nm.

Therefore, to achieve the above object, a semiconductor laser module according to the present invention comprises a semiconductor laser device for emitting laser light with a center wavelength in a range of 1300 to 1440 nm, an optical fiber for receiving laser light emitted from the semiconductor laser device and guiding the laser light, and a package for accommodating the semiconductor laser device and hermetically sealing a light path for the laser light extending from the semiconductor laser device to the incident end of the optical fiber, the optical fiber extending from the package, wherein an amount of moisture in the package is limited to 100000 ppm by volume or less.

The semiconductor laser module of the present invention ensures a stabilized oscillating state of a semiconductor laser device for emitting the laser light with the center wavelength in a range of 1300 to 1440 nm.

Also, to achieve the above object, an optical measuring method according to the present invention comprises steps of preparing a light path for a laser light, an amount of moisture in said light path being limited to 100000 ppm by volume or less, and measuring a characteristic of the laser light with a center wavelength in a range of 1300 to 1440 nm when the laser light is emitted from an output end of an optical fiber and travels in the light path.

The optical measuring method of the present invention stably and precisely measures the optical characteristics of laser light, the center frequency of which is in a range of 1300 to 1440 nm.

Further, to achieve the above object, an optical measuring apparatus according to the present invention comprises a measuring device for receiving laser light with a center wavelength in a range of 1300 to 1440 nm, emitted from an output end of an optical fiber, to measure a characteristic of said laser light, said laser light travelling along a light path, and a main container for accommodating said measuring device and airtight sealing at least a spatial propagation path portion of said light path for said laser light extending from the output end of said optical fiber to said measuring device, wherein an amount of moisture in said main container is limited to 100000 ppm by volume or less.

The optical measuring apparatus of the present invention stably and precisely measures the optical characteristics of laser light with the center frequency in a range of 1300 to 1440 nm.

BRIEF DESCRIPTION OF THE DRAWINGS

The present invention will become more fully understood from the detailed description given hereinbelow and the accompanying drawings, which are given by way of illustration only, and thus, are not limitative of the present invention, and wherein:

FIG. 20 is a front cross-sectional view showing an LD module according to a fifth embodiment of the present invention;

FIG. 21 is a front cross-sectional view showing an LD module according to a sixth embodiment of the present invention;

FIGS. 22A and 22B are schematic diagrams showing experiment devices used in experiments conducted for investigating the influence of moisture exist in a light path when the optical characteristics of laser light were measured;

DETAILED DESCRIPTION OF THE INVENTION

Figure 1:
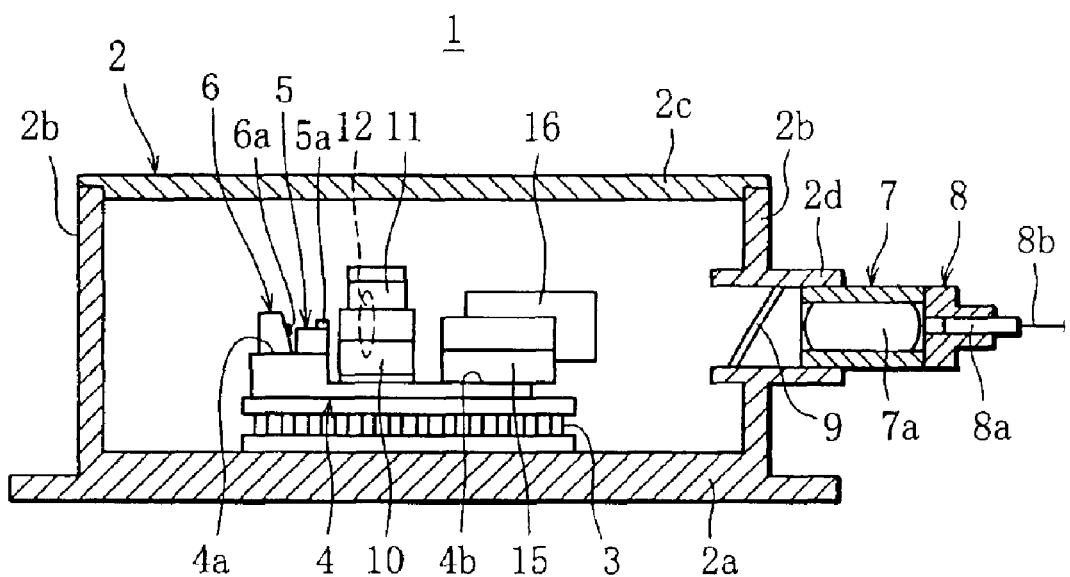
FIG. 1 is a front cross-sectional view showing an LD module according to a first embodiment of the present invention.

The inventors intensively studied an oscillating condition of a laser light from an LD device in an LD module for emitting the laser light in a wavelength band of 1300 to 1440 nm, and a measuring condition of an optical measuring apparatus for measuring the laser light in the wavelength band of 1300 to 1440 nm.

In the conventional LD module, a package for accommodating an LD device is hermetically sealed. However, no consideration has been made with respect to an amount of moisture in the package. In addition, a moisture absorption band for laser light lies near 1300 to 1440 nm. Based on these facts, it is considered that laser light in the wavelength band of 1300 to 1440 nm emitted from the LD device may be absorbed by moisture in a spatial propagation path when the laser light is propagating through the space within the package.

Also, in a conventional optical measuring apparatus, a main container for accommodating a measuring device and the measuring device itself are typically not hermetically sealed. It is therefore considered that laser light to be measured in a wavelength band of 1300 to 1440 nm is absorbed by moisture in a spatial propagation path when the laser light is propagating through the space within the optical measuring apparatus. In this case, this causes disturbance in the amount of laser light received by the measuring apparatus, thereby making it difficult to perform precise measurements of optical characteristics.

As a result of a variety of investigations, the inventors reached a prediction that an unstable oscillating state of the laser light from the LD device in the LD module would be caused by the absorption, and the like by moisture which existed in the light path for the laser light within the package. The inventors also thought that in this case, consideration should be made not only to the amount of moisture in the spatial propagation path for the laser light but also to the amount of moisture contained in optical element such as a lens existing halfway on the light path.

Furthermore, the inventors reached a prediction that a low measuring accuracy in the optical measuring apparatus would be also caused by the absorption, and the like of laser light by moisture existing in a propagation space within the main container and a propagation space within the measuring device.

The term "moisture" used herein is a concept which includes a hydroxyl group. Also, the value representative of the amount of moisture (ppm by volume) indicated in this specification is measured at a temperature of 25° C. under a standard atmospheric pressure (101325 Pa).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Embodiments of an LD module and an optical measuring apparatus according to the present invention will be described in detail with reference to the drawings as follows.

First Embodiment

As shown in FIG. 1, an LD module 1 according to this embodiment comprises a package 2. The package 2 contains a temperature control device 3, a base 4, an LD carrier 5, an LD device 5a, a PD (photodiode) carrier 6, a first lens holder 11, a light isolator 16, and the like.

The package 2 has a bottom plate 2a, a peripheral wall 2b, and a cover 2c mounted on the peripheral wall 2b. A flange 2d is protrusively formed on the peripheral wall 2b. A second lens holder 7 is fixed to the flange 2d by welding at a plurality of spots with a YAG laser. A hermetic window 9 is located in the flange 2d at an inclination with respect to the optical axis of laser light emitted from the LD device 5a (hereinafter simply called the "optical axis").

Figure 2:
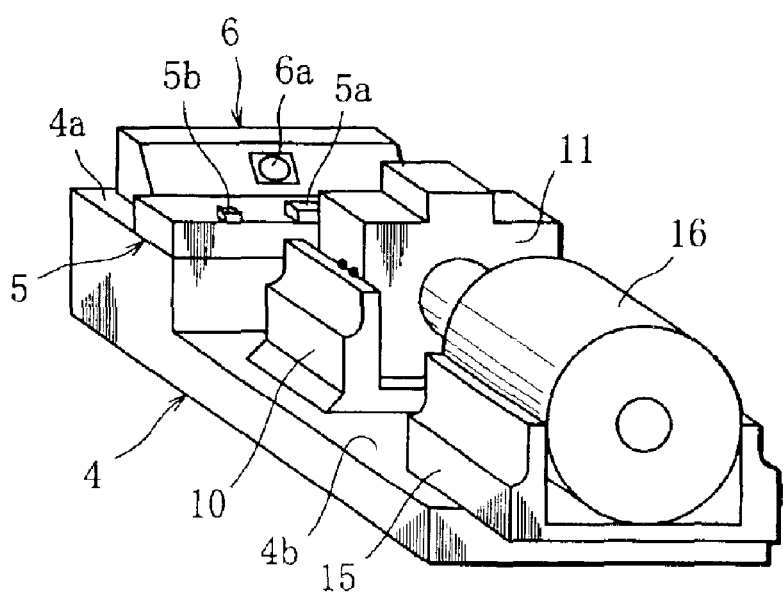
FIG. 2 is a perspective view showing a portion of the LD module in FIG. 1 in an enlarged scale.

The temperature control device 3, which includes a Peltier element for cooling down heat generated by the LD device 5a during its operation so as to control the LD device 5a to a predetermined temperature, is disposed on the bottom plate 2a in the package 2. The temperature of the LD device 5a is controlled by adjusting the value of a current flowing into the temperature control device 3, based on a temperature measured by a thermistor 5b disposed near the LD device 5a, as shown in FIG. 2. Also, the base 4 is provided on the temperature control device 3.

As shown in FIGS. 1 and 2, the base 4, which is a plate-shaped member, has a first mount 4a and a second mount 4b in the direction of the optical axis (from left to right in FIG. 1). The second mount 4b is lower than the first mount 4a. The LD carrier 5 and PD carrier 6 are respectively disposed on the first mount 4a, while a first fixing member 10 and a second fixing member 15 are respectively disposed on the second mount 4b. The first fixing member 10 and second fixing member 15 are fixing members for fixing the first lens holder 11 and light isolator 16, respectively, as described later.

The LD device 5a for emitting laser light, the center wavelength of which is in a range of 1300 to 1440 nm, is disposed on the LD carrier 5 near the first fixing member 10. The LD device 5a is positioned, for example, such that a distance between its active layer and the optical axis of a first lens 12 (as described later) in the height direction is limited within several μm.

A photodiode 6a is disposed on an incline of the PD carrier 6 adjacent to the LD carrier 5. The photodiode 6a opposes to the LD device 5a. For this reason, the laser light with the center wavelength in a range of 1300 to 1440 nm (although up to 1495 nm maybe used) emitted from the front facet of the LD device 5a, is directed to the first lens 12. Also, light emitted from the rear facet of the LD device 5a is directed to and monitored by the photodiode 6a.

As shown in FIG. 2, the first fixing member 10 is formed substantially in a U-shape, with the first lens holder 11 welded thereto. The first lens holder 11, made of a metal such as stainless steel or the like, is formed with a circular hole in the direction of the optical axis for passing the laser light therethrough. The first lens 12 is fitted in the circular hole of the lens holder 11. Specifically, the outer periphery of the first lens 12 is fixed to the inner periphery of the circular hole with low melting point glass. The first lens 12 is a collimator lens for collimating the laser light emitted from the LD device 5a.

The second fixing member 15 is also formed substantially in a U-shape in a manner similar to the first fixing member 10, as shown in FIG. 2, and is disposed adjacent to the first fixing member 10. The light isolator 16 formed in a cylindrical shape is fixed to the second fixing member 15, as shown in FIG. 2.

As shown in FIG. 1, the second lens holder 7 is a cylindrical body in which the second lens 7a is fitted for serving as a condense lens, and is welded to the flange 2d by the YAG laser. A fiber fixing member 8 is welded to an end face of the second lens holder 7 by the YAG laser, while a ferrule 8a is welded to the fiber fixing member 8 by the YAG laser. In other words, a gap between the flange 2d of the package 2 and the second lens holder 7, a gap between the second lens holder 7 and the fiber fixing member 8, and a gap between the fiber fixing member 8 and the ferrule 8a are hermetically sealed. An optical fiber 8b extends from the ferrule 8a.

In this way, the LD device 5a for emitting laser light with the center wavelength in a range of 1300 to 1440 nm, is accommodated in the package 2, and a path through which the laser light propagates in the space, within a light path extending from the LD device 5a to an incident end of the optical fiber 8b, i.e., a spatial propagation path is hermetically sealed by the package 2. Then, the package 2 is filled with a nitrogen gas at the standard atmospheric pressure, in which the amount of moisture is limited to a lower value than 100000 ppm by volume. Also, materials which contain least possible amounts of moisture are selectively used for the optical elements disposed halfway on the light path extending from the LD device 5a to the incident end of the optical fiber 8b, i.e., the first lens 12, light isolator 17, hermetic window 9, and second lens 7a. Likewise, a material which contains a least possible amount of moisture is selectively used for the optical fiber 8b.

Therefore, the total of the amount of moisture in the package 2 and that contained in the optical elements (first lens 12, light isolator 17, hermetic window 9, and second lens 7a), i.e., the total amount of moisture in the light path extending from the LD device 5a to the incident end of the optical fiber 8b is limited to 100000 volume ppm or less.

Next, a description will be given of a method of manufacturing the LD module 1 configured as described above.

First, the LD device 5a is carried on the LD carrier 5, and the photodiode 6a is carried on the PD carrier 6. Then, the LD carrier 5 and PD carrier 6 are electrically connected to the LD device 5a and photodiode 6a, respectively, by wire bonding. Subsequently, the LD carrier 5 and PD carrier 6 are respectively mounted on the first mount 4a of the base 4, and fixed by soldering.

Next, the first fixing member 10 is disposed on the second mount 4b of the base 4 in close proximity to the LD carrier 5. The lens holder 11 with the first lens 12 attached thereto is fitted into the first fixing member 10. Then, the LD device 5a is driven to emit laser light toward the first lens 12. In this state, the first fixing member 10 and first lens holder 11 are moved along the optical axis to adjust the positions thereof in the direction of the optical axis such that the laser light from the LD device 5a passes through the first lens 12 to provide collimated light. Once the laser light passing through the first lens 12 becomes collimated light in this way, the first fixing member 10 is first welded to the base 4 by a YAG laser, and subsequently, the first lens holder 11 is welded to the first fixing member 10.

Next, the light isolator 16 is fitted into the second fixing member 15 which has been previously carried on the second mount 4b at a position adjacent to the first fixing member 10. In this state, the light isolator 16 is rotated about the optical axis while the laser light emitted from the LD device 5a and passing through the first lens 12 is directed to the light isolator 16. Then, at a rotating position at which the light intensity emitted from an exit face of the light isolator 16 becomes maximal, the light isolator 16 is welded to the second fixing member 15 by the YAG laser.

Next, the temperature control device 3 is attached onto the bottom plate 2a of the package 2, and leads (not shown) of the temperature control device 3 are connected to the package 2 by soldering. Subsequently, the base 4, which comprises the LD carrier 5 provided with the LD device 5a, the PD carrier 6 provided with the photodiode 6a, the first fixing member 10 fixing the first lens holder 11, and the second fixing member 15 fixing the light isolator 16, in the foregoing manner, is fixed on the temperature control device 3 by soldering. Subsequently, electrodes of the LD carrier 5 and PD carrier 6 are connected to leads (not shown) of the package 2 with gold wires (not shown) by wire bonding.

Next, in the atmosphere of nitrogen gas at the standard atmospheric pressure, dried by raising the temperature or the like to limit the amount of moisture thereof to a value lower than 100000 ppm by volume, the cover 2a is mounted on the peripheral wall 2b of the package 2 for airtight sealing.

Figure 3:
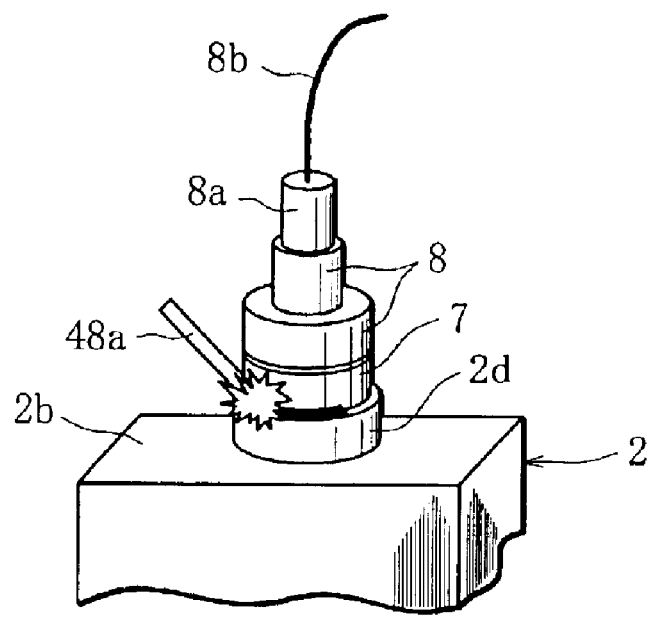
FIGS. 3 to 7 are perspective views for explaining a method of airtight sealing a package of the LD module in FIG. 1, respectively;.

Subsequently, as shown in FIG. 3, the second lens holder 7 is welded to an end of the flange 2d of the package 2 by the YAG laser to airtightly seal the gap between both parts. Specifically, with an end portion of the second lens holder 7 inserted into the end of the flange 2d, the YAG laser is rotated around the flange 2d to irradiate the inner circumference of the end face of the flange 2d with YAG laser light 48a for welding. Alternatively, in this case, the package 2 may be rotated instead of rotating the YAG laser. Also, instead of the YAG laser, a $CO_2$ (carbon dioxide gas) laser or the like, for example, may be used for welding.

In a similar manner, the fiber fixing member 8 is welded on an end face of the second lens holder 7 by the YAG laser to hermetically seal the gap therebetween. Also, the ferrule 8a from which the optical fiber 8b extends is inserted into the fiber fixing member 8, and the fiber fixing member 8 is welded to the ferrule 8a by the YAG laser to hermetically seal the gap therebetween.

Figure 4:
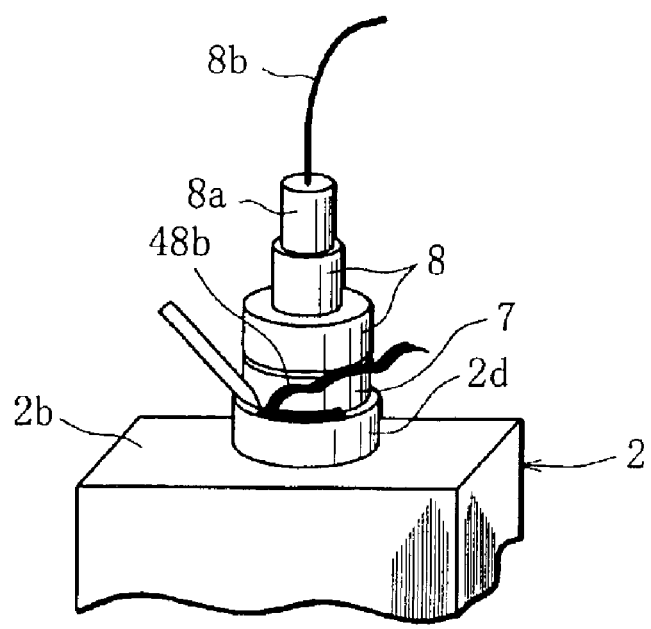

While the foregoing description has been made in the case where the welding method with the YAG laser is used for airtight sealing the gap between the flange 2d of the package 2 and the second lens holder 7, the gap between the second lens holder 7 and the fiber fixing member 8, and the gaps between the fiber fixing member 8 and the ferrule 8a, other methods may be used for the airtight sealing. For example, as shown in FIG. 4, a soldering material 48b may be used for soldering to seal the gaps at the above three locations. In this case, the soldering is advantageous over the welding based on the YAG laser or the like in that the operation is easier.

Figure 5:
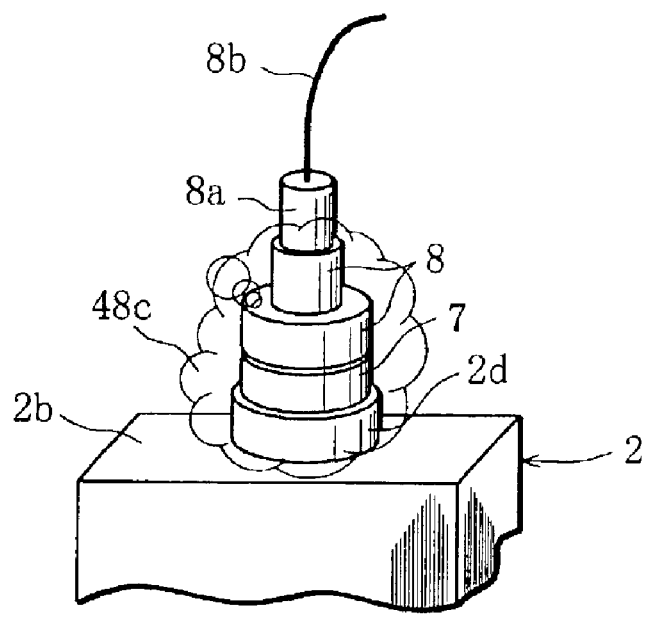

Also, for example, as shown in FIG. 5, an adhesive 48c may be used to cover the entirety from the flange 2d to the ferrule 8a to seal the gaps at the three locations. In this case, since the gaps at the three locations can be covered together, the workability is advantageously improved. Alternatively, a resin may be used instead of the adhesive 48c.

Figure 6:
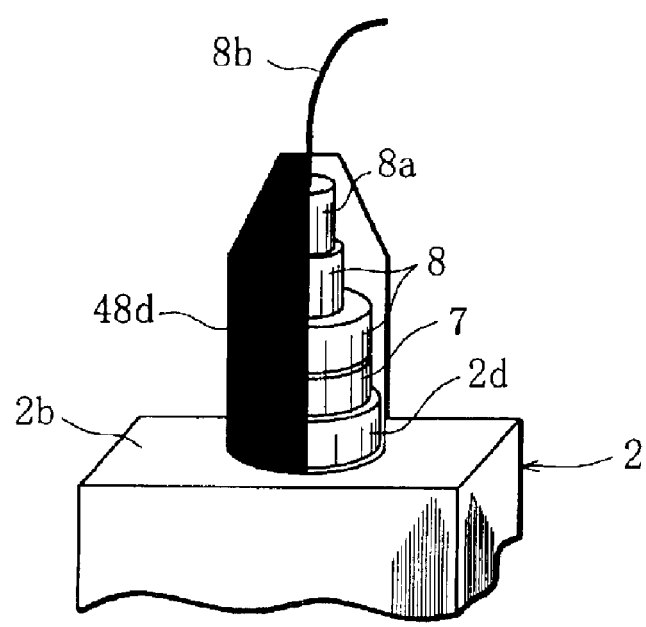

Also, for example, as shown in FIG. 6, a flexible cylindrical rubber boot 48d may be used to cover the entirety from the flange 2d to the optical fiber 8b. The boot 48d cooperates with an adhesive (not shown) filled therein to seal the gaps at the three locations. A similar structure to the structure of FIG. 6 may be obtained by covering the structure of FIG. 5 with the boot 48d. In this case, since the three locations are sealed with the double-seal structure having the adhesive (or the adhesive 48c) and the boot 48d, the hermetic seal for the package 2 is advantageously improved. Of course, the rubber boot 48d may cover a portion from the flange 2d to the ferrule 8a.

Figure 7:
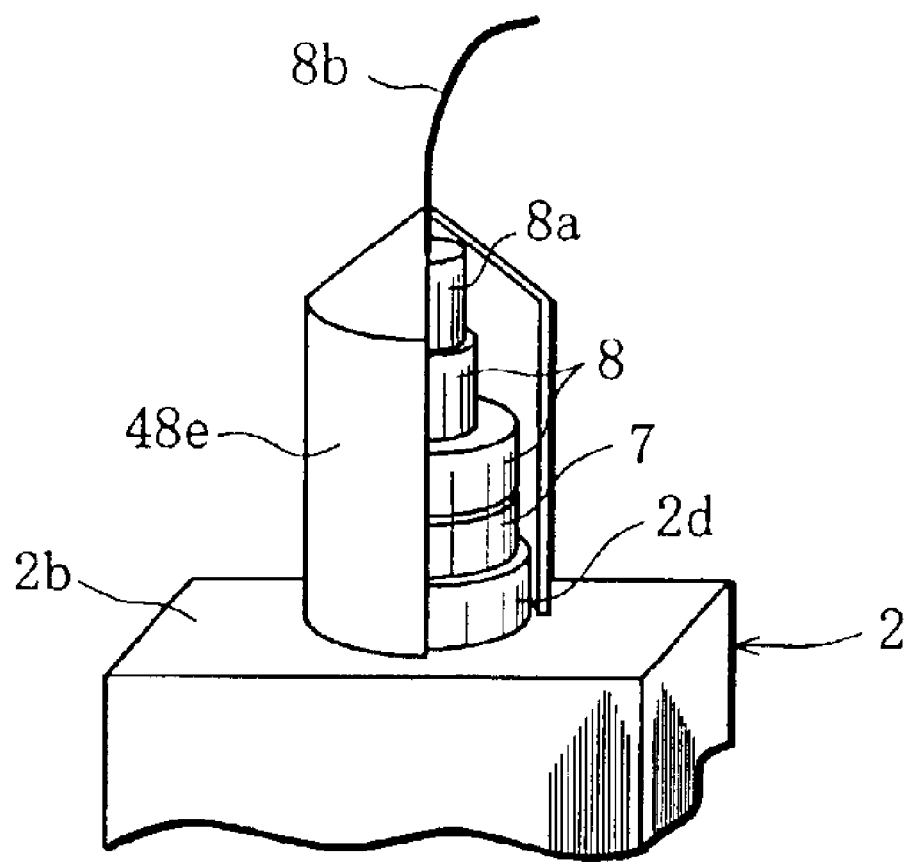

Also, for example, as shown in FIG. 7, a cylindrical metal cover 48c may be used to cover the whole region from the flange 2d to the optical fiber 8d so that the gaps of the three locations are hermetically sealed. In this case, since the gaps of the three locations are sealed together, the workability is advantageously improved.

Further, an adhesive (not shown) may be filled into the metal cover 48c in a similar way of the case of the rubber boot 48d, or the metal cover 48c may cover the structure of FIG. 5. In these cases, the hermetic seal for the package 2 is advantageously improved by the double-seal structure.

However, in a case of using the metal cover 48e, it is necessary to hermetically seal the contact portion of the flange 2d with the metal cover 48e, and the contact portion of the optical fiber 8b with the metal cover 48e. In this event, in view of maintaining the strength and the like, it is preferred that appropriate methods are selectively used, i.e., laser welding or soldering for sealing the contact portion between the flange 2d and the metal cover 48e, and for the contact portion between the optical fiber 8b and the metal cover 48e methods of adhesion with an adhesive or a resin, or interposing a flexible member therebetween, and the like. Of course, in this event, the metal cover 48e may also cover a portion from the flange 2d to the ferrule 8a.

Alternatively, the rubber boot 48d or metal cover 48e may cover the three locations after these location has been sealed by the laser welding or soldering as shown in FIGS. 3 and 4. Similarly, the hermetic seal for the package 2 is advantageously improved by the double-seal structure.

Alternatively, a thermally contractible tube may be used instead of the rubber boot 48d in FIG. 6, or the metal cover 48e in FIG. 7. In this case, the airtightness within the package 2 is further improved, advantageously.

In addition to various airtight sealing methods described above, a waterproof tape may be wound around the hermetically sealed locations. In this case, the waterproof is also advantageously provided in addition to the airtightness.

In this way, the assembly of the LD module 1 is completed. In this case, the total amount of moisture in the light path extending from the LD device 5a which emits laser light with the center wavelength in a range of 1300 to 1440 nm, to the incident end of the optical fiber 8b is limited to 100000 ppm by volume or less.

The LD module 1 was manufactured on a trial basis using one of the foregoing manufacturing methods, and various characteristics thereof were measured. As to the LD module 1, the amount of moisture in the package 2 was measured to be 98250 ppm by volume when the temperature near the LD device 5a was 25° C. as measured by the thermistor 5b, the measured temperature of the package 2 was 65° C., and the pressure within the package 2 was slightly less than 101325 Pa.

Figure 8A:
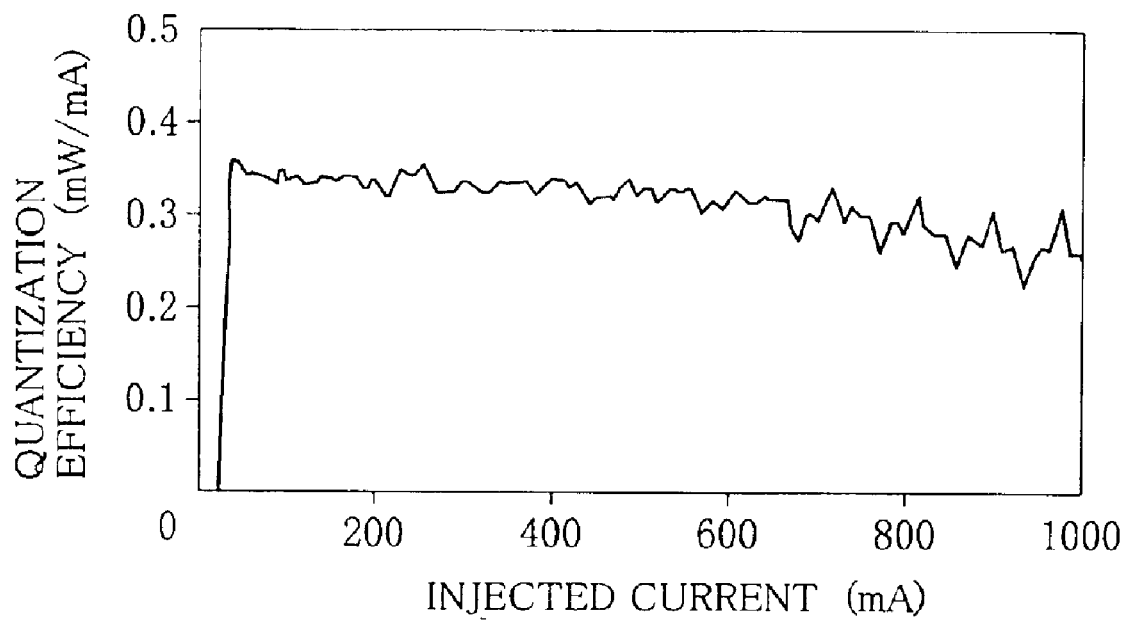
FIGS. 8A and 8B are graphs showing the quantum efficiency characteristic of the LD module in FIG. 1, and an LD module for comparison, respectively.

Then, a stable quantum efficiency characteristic was obtained as shown in FIG. 8A from a measurement result of the relationship between the value of current (mA) injected into the LD device 5a and the quantum efficiency (mW/mA) where the LD device 5a oscillated laser light with center wavelength of 1400 nm, for example. The quantum efficiency is derived by differentiating the laser light power of the LD device 5a by the value of current injected thereinto, and represents the stability of the light power.

For comparison, an LD module was manufactured by using an LD device for emitting laser light at the same center wavelength of 1400 nm, and airtight sealing the package in a nitrogen gas atmosphere without limiting the amount of moisture therein, with only difference in the atmosphere within the package. The amount of moisture in the package in this module was 250000 ppm by volume or more. Then, the relationship between the value of injected current (mA) and the quantum efficiency (mW/mA) was measured for this LD module. The measuring result indicated a very unstable quantum efficiency characteristic with a large kink found on the characteristic curve, as shown in FIG. 8B.

Figure 8B:
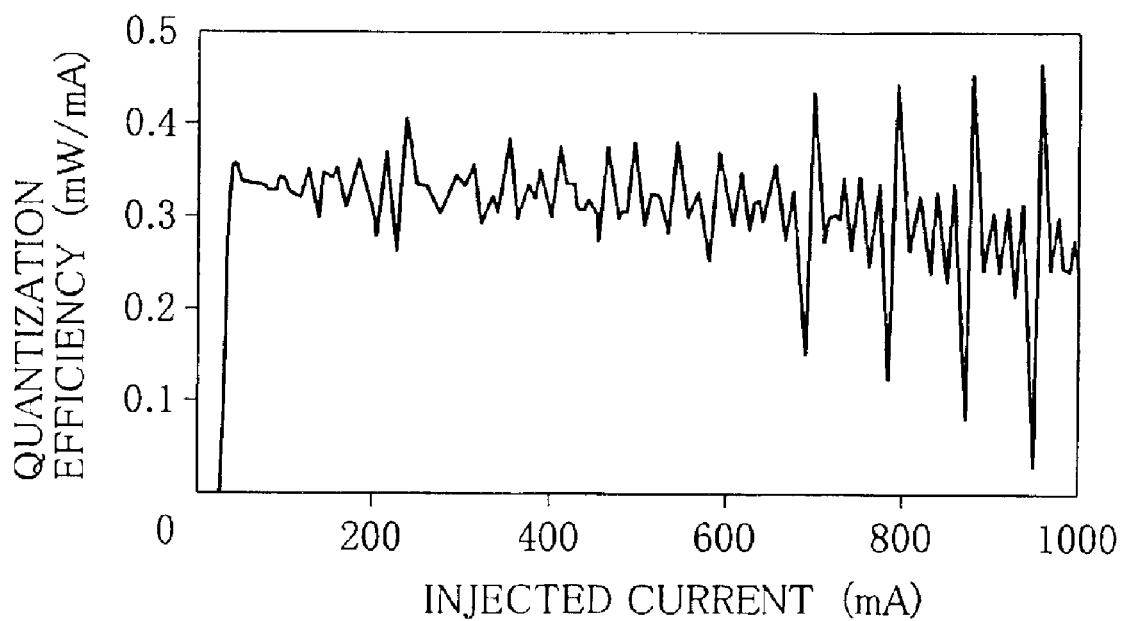
Figure 9:
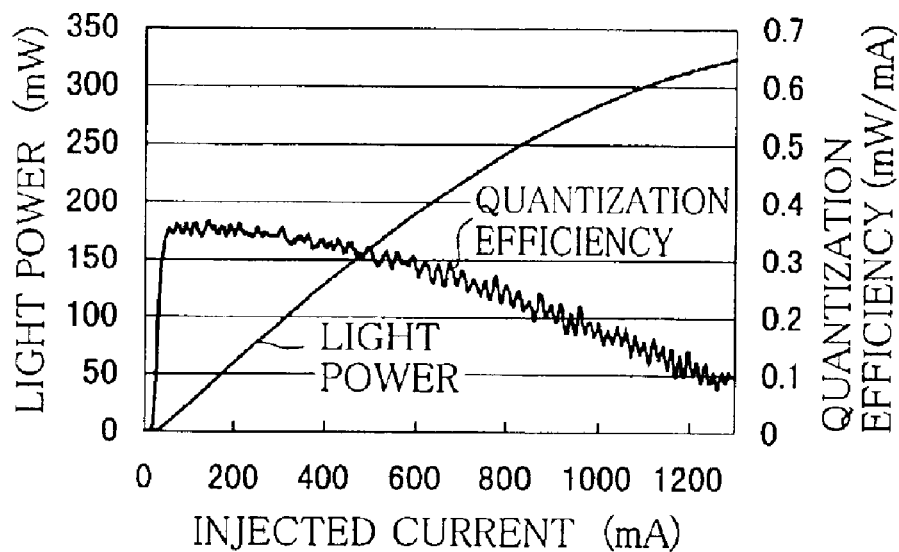
FIGS. 9 to 16 are graphs showing the light power characteristic and quantum efficiency characteristic when the amount of moisture in the package of the LD module in FIG. 1 is varied as a parameter, respectively.
Figure 10:
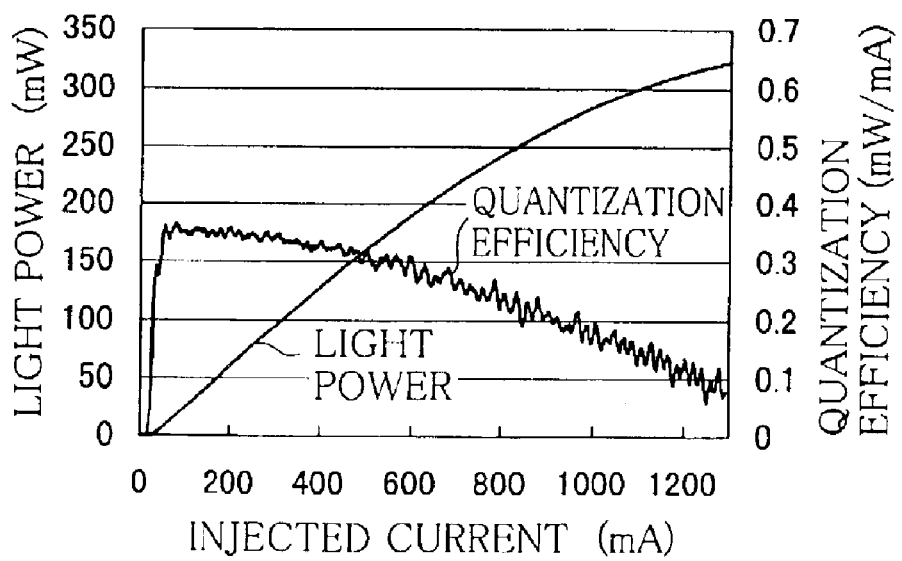
Figure 11:
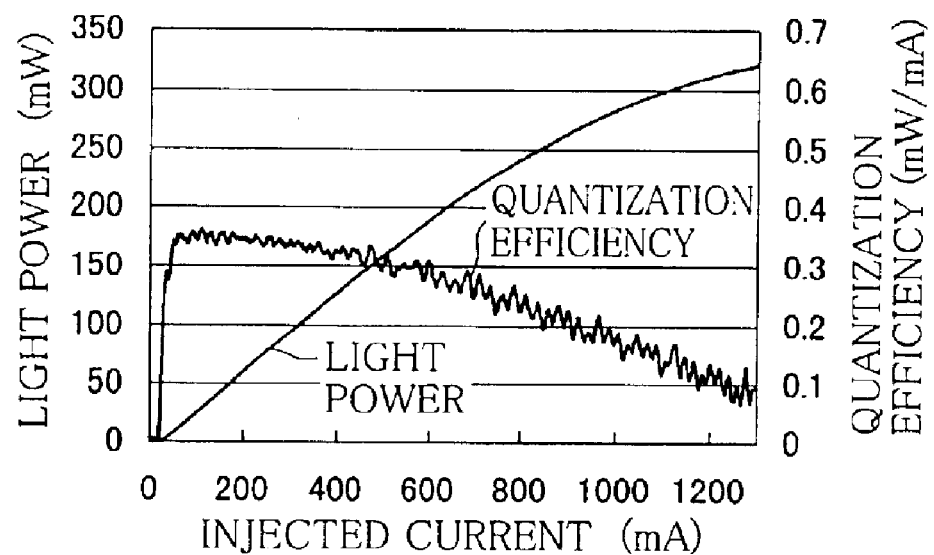
Figure 12:
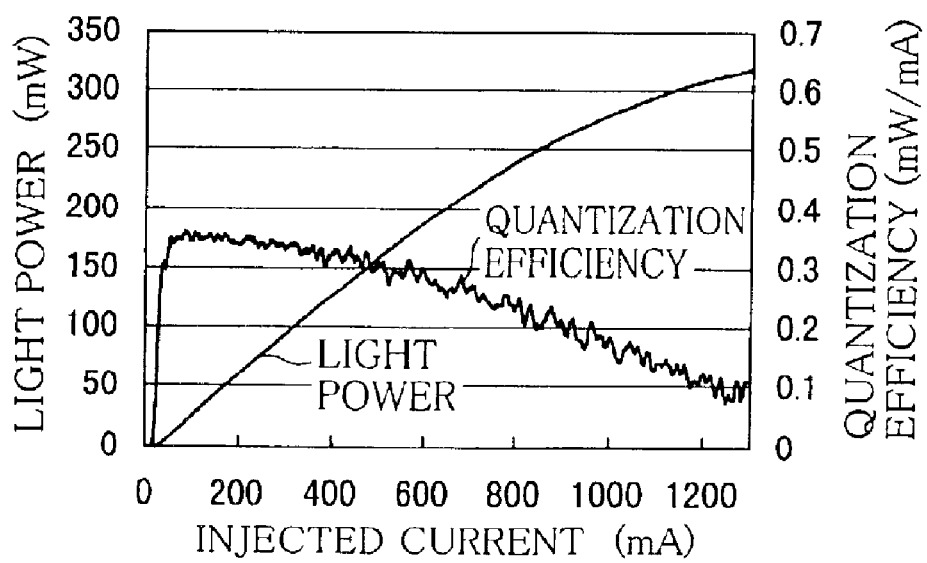
Figure 13:
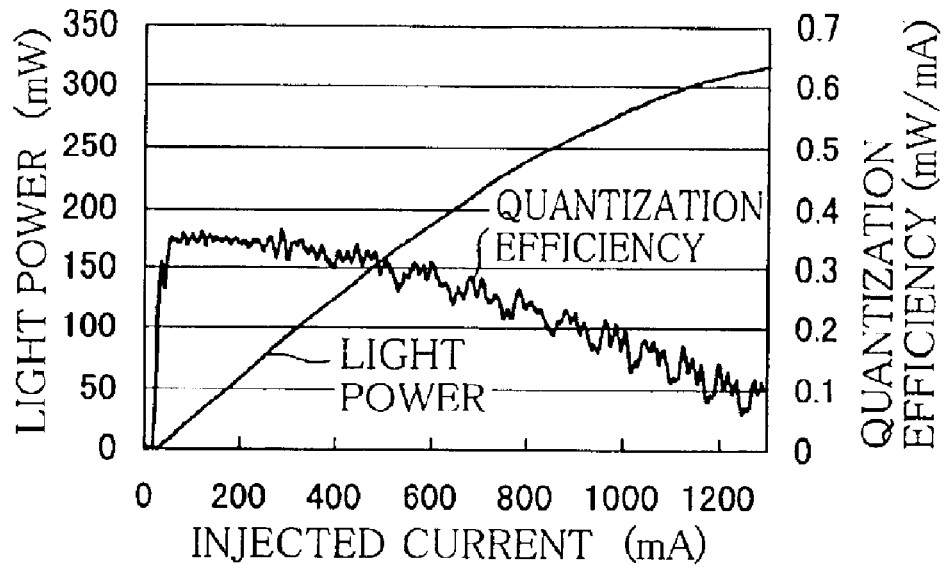
Figure 14:
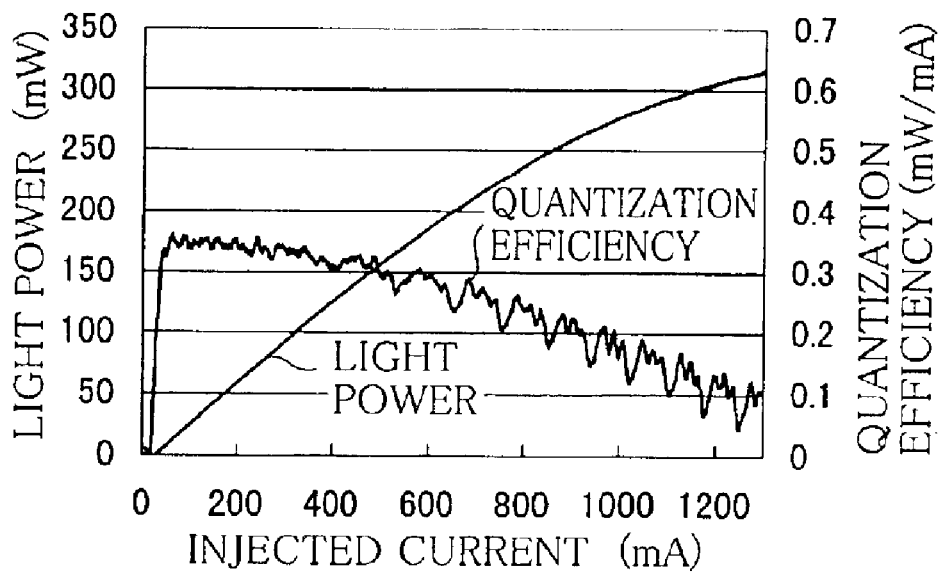
Figure 15:
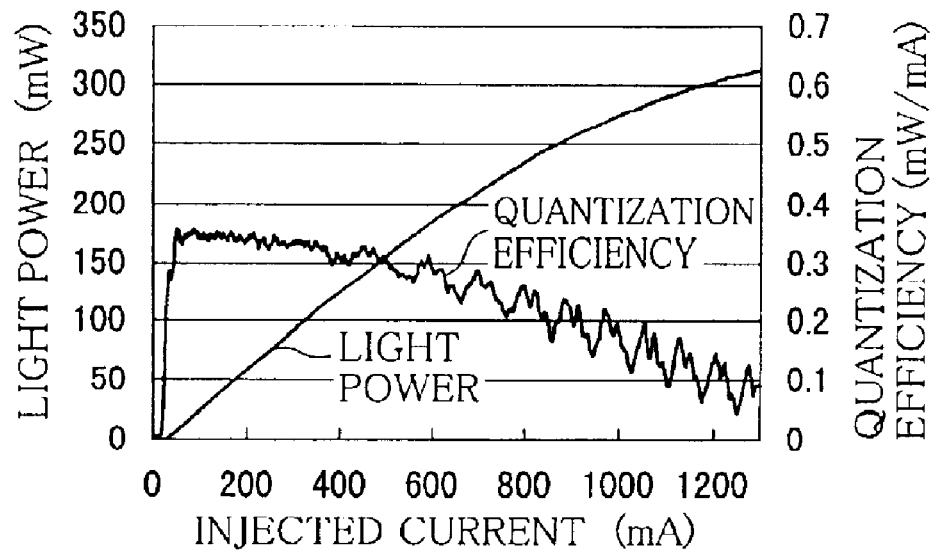
Figure 16:
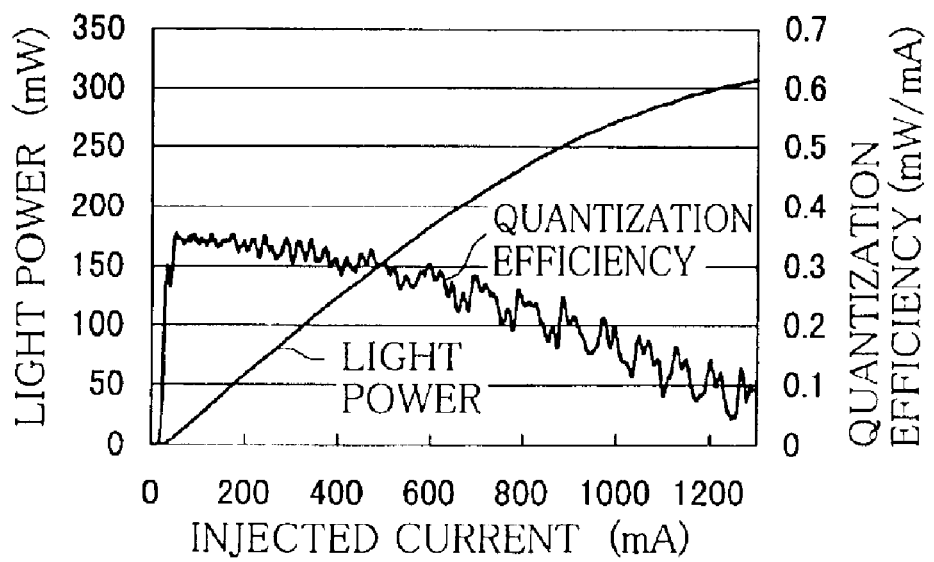

Thus, as is apparent from the results shown in FIGS. 8A and 8B, it was found that the LD device of the LD module emitted laser light with the center wavelength of 1400 nm in a stable oscillating state, when the amount of moisture in the light path of the laser light within the package is limited to 98250 ppm by volume.

Also, when the inventors made similar experiments while varying the center wavelength of the laser light emitted by the LD device, a similar result was obtained even with the center wavelength in a range of 1300 to 1440 nm, not limited to 1400 nm.

The inventors further made the following experiment with regard to an LD module which had laser light with the center wavelength in a range of 1300 to 1440 nm, for confirming to which concentration the amount of moisture should be reduced within the light path of the laser light within the package to stable the oscillating state of the LD device.

When the package 2 was hermetically sealed, a sealing operation was performed within a moist heat bath which could control the temperature and relative humidity to vary the amount of moisture in a nitrogen gas atmosphere. Specifically, the temperature was varied in a range of 5 to 85° C. with the relative humidity held at 85% to vary the amount of moisture. Then, the relationship between the value of current (mA) injected into the LD device 5a and the light power (mW) of the laser light, and the relationship (quantum efficiency characteristic) between the injected current value (mA) and the quantum efficiency (mW/mA) were measured, for example where the LD device 5a emitting laser light at the center frequency of 1395 nm was used. The results shown in FIGS. 9 to 16 were obtained from the measurements as described above.

As is apparent from FIGS. 9 to 16, when the temperature rises, i.e., when the amount of moisture increases higher than a boundary at which the temperature is 55° C. and the relative humidity is 85% (corresponding to 100000 ppm by volume in terms of the amount of moisture), a periodic kink remarkably appears in the quantum efficiency characteristic due to the moisture, causing unstable oscillating state of the LD device 5a. Therefore, when the amount of moisture in the light path within the package is decreased to 100000 ppm by volume or so, the quantum efficiency characteristic for practical use is obtained. Preferably, the amount of moisture is required to be equal to or less than 100000 ppm by volume for stabilizing the oscillating state of the LD module.

As described above, according to this embodiment, since the LD device 5a for emitting laser light, the center frequency of which is in a range of 1300 to 1440 nm, is accommodated in the package 2, and the light path extending from the LD device 5a to the incident end of the optical fiber 8b is hermetically sealed by the package 2 to limit the amount of moisture in the light path within the package 2 to 100000 ppm by volume or less, the LD module 1 which ensures a stable oscillating state of the LD device 5a can be obtained.

During the experiments in the foregoing embodiment, special attention was paid for measuring the laser light emitted from the LD module by installing a measuring system in a sufficiently dried nitrogen atmosphere so as to prevent the absorption of measured light by moisture in the light path within the measuring system. This also applies to second through sixth embodiments to be described later.

Second Embodiment

Figure 17:
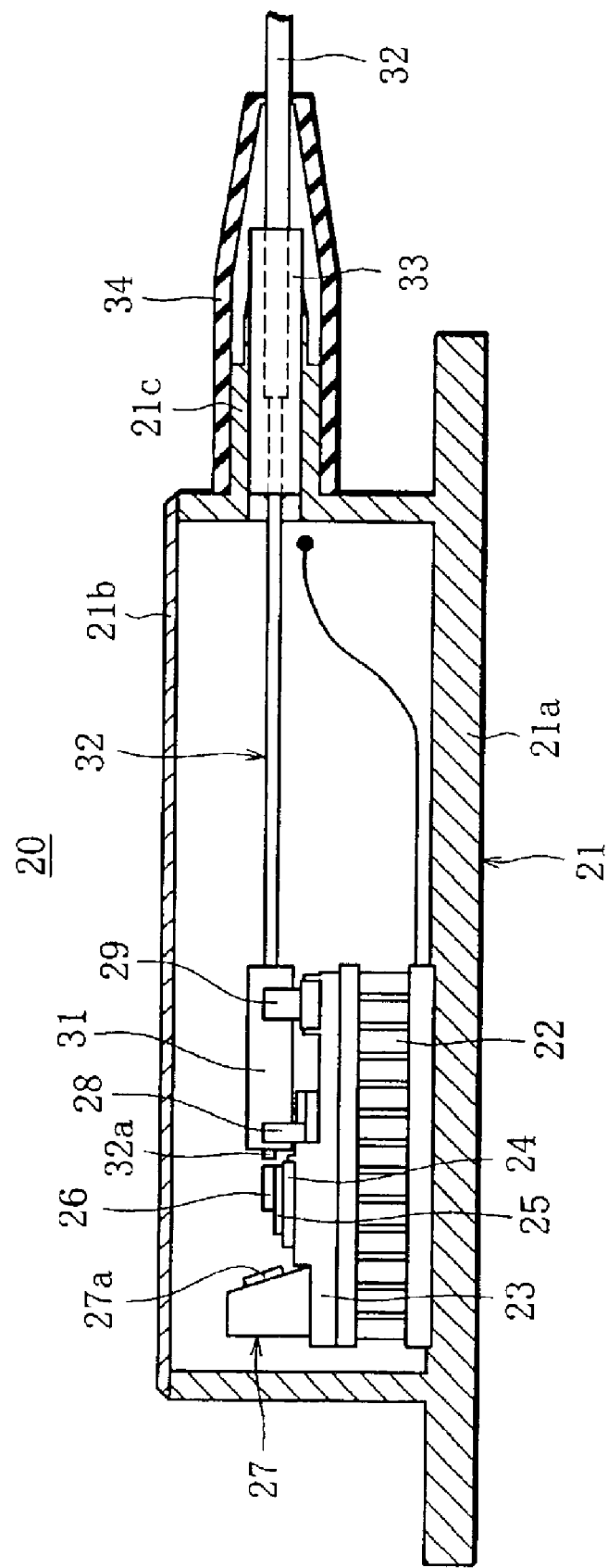
FIG. 17 is a front cross-sectional view showing an LD module according to a second embodiment of the present invention.

As shown in FIG. 17, an LD module 20 according to this embodiment comprises a package 21 made of metal. This package 21 has a body 21a and a lid 21b, and the body 21a is formed with a neck portion 21c.

A temperature control device 22 is disposed within the package 21, and a base 23 is placed on the temperature control device 22. At the substantially center portion on the top surface of the base 23, an LD carrier 24 is disposed. An LD device 26 for emitting laser light, the center wavelength of which is in a range of 1300 to 1440 nm, is disposed on the LD carrier 24 through a heat sink 25. Also, on the top surface of the base 23, a PD carrier 27 having a monitor photodiode 27a attached thereto is disposed on one side of the LD carrier 24, and a first ferrule 31 is disposed on the other side through ferrule holders 28 and 29.

A lensed fiber 32 is inserted through the first ferrule 31. A lens portion 32a is formed in a leading end of the lensed fiber 32, the leading end is protruded from the first ferrule 31 toward the LD device 26. The lens portion 32a is applied with metal plating (not shown) formed of Au or the like on an end surface of thereof. The lens portion 32a at the leading end of the lensed fiber 32 is aligned with the LD device 26 by centering. Therefore, the laser light at the center wavelength in a range of 1300 to 1440 nm emitted from a front facet of the LD device 26 is directed to the lens portion 32a of the lensed fiber 32. On the other hand, light emitted from a rear facet of the LD device 26 is directed to and monitored by the monitor photodiode 27a.

The other end of the lensed fiber 32 is led to the outside from the cylindrical neck portion 21c of the package 21. At a portion corresponding to the neck portion 21c of the lensed fiber 32, the second ferrule 33 of metal is mounted. The lensed fiber 32 and the first ferrule 31, the lensed fiber 32 and the second ferrule 33 are fixed at respective ferrule ends, for example, by a solder made of Au—Sn for airtight sealing.

Also, with the second ferrule 33 inserted into the neck portion 21c, the end of the neck portion 21c is welded to the second ferrule 33 over the entire periphery thereof by a YAG laser to airtight seal the gap between the neck portion 21c of the package 21 and the second ferrule 33. Further, the entirety from the neck portion 21c to a portion of the lensed fiber 32 outside the second ferrule 33 is covered with a flexible cylindrical rubber boot 34 to increase the airtightness.

Thus, the LD device 26 for emitting laser light with the center wavelength in a range of 1300 to 1440 nm, is accommodated in the package 21, and the light path extending from the LD device 26 to the lens portion 32a of the lensed fiber 32 is hermetically sealed by the package 21. Then, the package 21 is filled with a nitrogen gas at the standard atmospheric pressure with the amount of moisture limited to a value lower than 100000 ppm by volume. Therefore, the amount of moisture in the light path extending from the LD device 5a to the lens portion 32a of the lensed fiber 32 is limited to 100000 ppm by volume or less.

Next, a description will be given of a method of manufacturing the LD module 20 constructed as described above.

First, the temperature control device 22 is placed in the body 21a of the package 21. Also, the PD carrier 27 having the monitor diode 27a attached thereto, the LD carrier 24 provided with the LD device 26 through the heat sink 25, and the ferrule holders 28 and 29 are placed in order on the base 23, and fixed by soldering, respectively. Then, the base 23 is carried on the temperature control device 22.

Next, the lensed fiber 32 having the second ferrule 33 attached thereto is introduced into the body 21a from the neck portion 21c of the package 21, the lens portion 32a at the leading end of the lensed fiber 32 is aligned with the LD device 26, and the first ferrule 31 is fixed to the ferrule holders 28 and 29.

Next, in the nitrogen gas atmosphere at the standard atmospheric pressure, dried by raising the temperature or the like to limit the amount of moisture to 100000 ppm by volume or less, the lid 21b is attached to the body 21a of the package 21 by resistive seam welding. Also, the second ferrule 33 inserted in the neck portion 21c of the package 21 is welded to the end of the neck portion 21c by a YAG laser, and the entirety from the neck portion 21c to the portion of the lensed fiber 32 outside the second ferrule 33 is covered with the rubber boot 34.

Here, a combination of laser welding and covering with the rubber boot 34 is used for airtight sealing the gap between the neck portion 21c and the second ferrule 33. Alternatively, a variety of methods introduced in the first embodiment using FIGS. 3 to 7 and the like can of course be employed individually or in combination.

Thus, the assembly of the LD module 20 is completed. In this case, the amount of moisture in the light path extending from the LD device 26 for emitting the laser light with the center wavelength in a range of 1300 to 1440 nm, to the lens portion 32a of the lensed fiber 32 is limited to 100000 ppm by volume or less.

When the optical characteristics of the LD module 20 manufactured as described above are measured, substantially similar results to those of the first embodiment were obtained. Therefore, this embodiment can also provides substantially similar advantages to the first embodiment, and realize the LD module 20 that can emit laser light with the center wavelength in a range of 1300 to 1440 nm stably from the LD device 26.

Third Embodiment

An LD module in this embodiment partially has the same components as the LD module 1 according to the first embodiment. Thus, the following description will be centered on components which are different from those in the LD module 1. The same components are designated the same reference numerals in the drawings and description to omit the redundant description.

Figure 18:
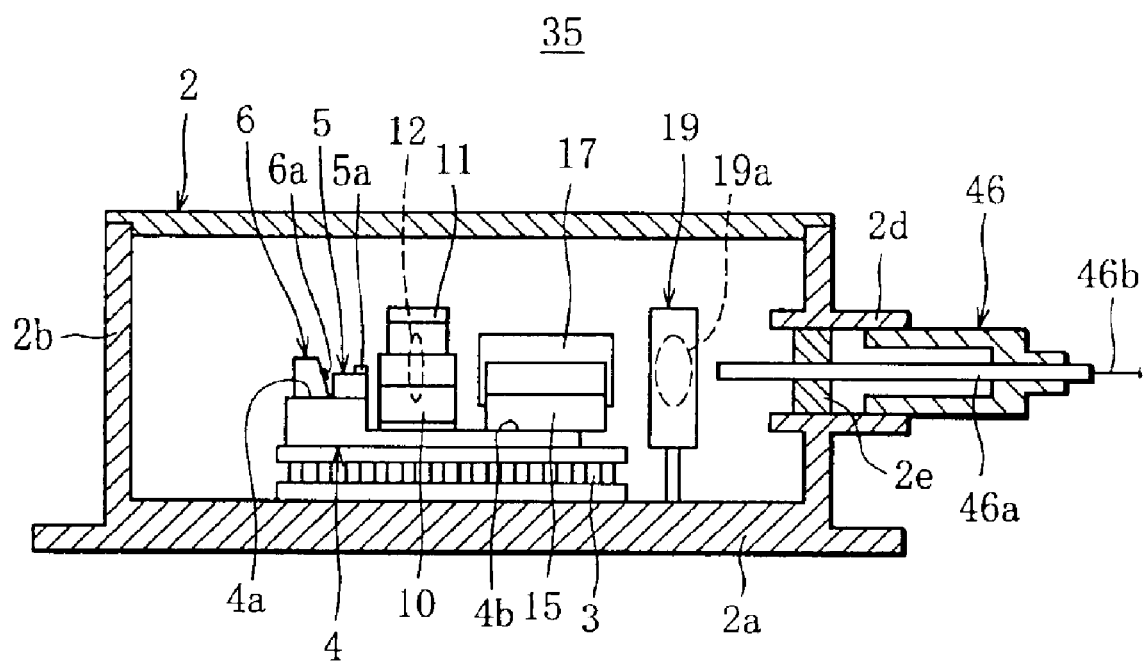
FIG. 18 is a front cross-sectional view showing an LD module according to a third embodiment of the present invention.

As shown in FIG. 18, an LD module 35 according to this embodiment comprises a second lens holder 19 which holds a second lens 19a serving as a condenser lens on the bottom plate 2a between a light isolator 17 and the flange 2d. A fixing member 46 is welded to the flange 2d of the package 2 by a YAG laser, and a ferrule 46a is welded to the fixing member 46 by a YAG laser. The ferrule 46 is protruded into the inside of the package 2 and has one end located in the vicinity of the second lens 19a. The ferrule 46a is formed to taper from the second lens holder 19 side to the fixing member 46. An optical fiber 46b extends from the ferrule 46a. In this way, a gap between the flange 2d of the package 2 and the fixing member 46, and a gap between the fixing member 46 and the ferrule 46a are hermetically sealed. Also, a seal 2e is disposed between the ferrule 46a and the flange 2d for airtight sealing the package 2.

In this way, the LD device 5a for emitting laser light with the center wavelength in a range of 1300 to 1440 nm, is accommodated in the package 2, and the light path extending from the LD device 5a to the incident end of the optical fiber 46b is hermetically sealed by the package 2. Then, the package 21 is filled with a nitrogen gas at the standard atmospheric pressure, in which the amount of moisture is limited to a value lower than 100000 ppm by volume.

Similarly to other optical elements such as the first lens 12 and the like, a material which contains a least possible amount of moisture is selectively used for the second lens 19a. Also, a material which contains a least possible amount of moisture is selectively used for the optical fiber 46b as well.

Therefore, the total of the amount of moisture in the package 2 and the amount of moisture contained in the optical elements (first lens 12, light isolator 17, and second lens 19a), i.e., the total amount of moisture in the light path extending from the LD device 5a to the incident end of the optical fiber 46b is limited to 100000 ppm by volume or less.

Next, a description will be given of a method of manufacturing the LD module 35 constructed as described above.

Similar to the manufacturing process in the first embodiment, the base 4 including the LD device 5a, photodiode 6a, first lens 12, and light isolator 17 is fixed on the temperature control device 3 mounted on the bottom plate 2a within the package 2.

Subsequently, the second lens holder 19 which holds the second lens 19a is placed on the bottom plate 2a between the light isolator 17 and the flange 2d. Also, the ferrule 46a, from which the optical fiber 46b extends, is inserted into the package 2 from the flange 2d, such that the leading end of the ferrule 46a is directed to the second lens holder 19. Then, the second lens 19a and ferrule 46a are positioned with respect to the LD device 5a such that the laser light emitted from the LD device 5a enters the incident end of the optical fiber 46b through the second lens holder 19. Subsequently, the second lens holder 19 is fixed on the bottom plate 2a.

Next, in the nitrogen gas atmosphere at the standard atmospheric pressure, dried by raising the temperature or the like to limit the amount of moisture to a value lower than 100000 ppm by volume, a cover 2a is airtightly mounted on the peripheral wall 2b of the package 2. Also, the flange 2d of the package 2 is welded to the fixing member 46 by the YAG laser, while the fixing member 46 is welded to the ferrule 46a by the YAG laser. Thus, a gap between the flange 2d and the fixing member 46, and a gap between the fixing member 46 and the ferrule 46a are hermetically sealed.

Alternatively, a variety of methods introduced in the first embodiment using FIGS. 3 to 7 and the like can of course be employed individually or in combination instead of the laser welding based airtight sealing as described above.

In this way, the assembly of the LD module 35 is completed. In this case, the amount of moisture in the light path extending from the LD device 5a for emitting the laser light with the center wavelength in a range of 1300 to 1440 nm, to the incident end of the optical fiber 46b is limited to 100000 ppm by volume or less.

When the optical characteristics of the LD module 35 manufactured as described above are measured, substantially similar results to those of the first embodiment were obtained. Therefore, this embodiment can also provide substantially similar advantages to the first embodiment, and realize the LD module 35 that can emit laser light with the center wavelength in a range of 1300 to 1440 nm stably from the LD device 5a.

Fourth Embodiment

An LD module in this embodiment is partially configured in a substantially similar manner to the LD module 1 according to the first embodiment. Thus, the following description will be centered on those components which are different from those in the LD module 1. The same components are designated the same reference numerals in the drawings and description to omit the redundant description.

Figure 19:
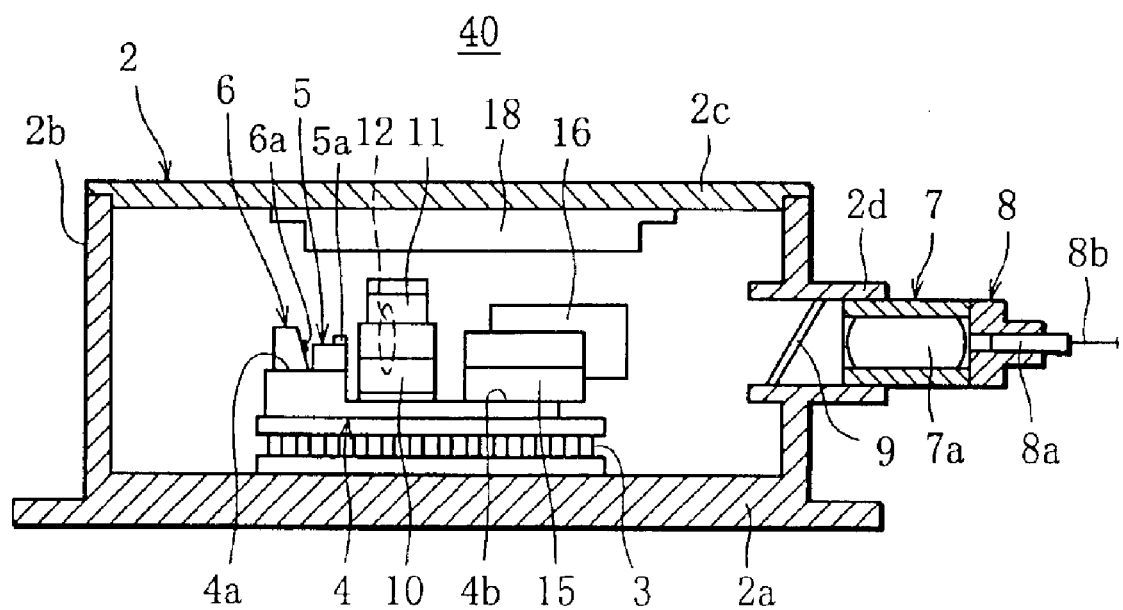
FIG. 19 is a front cross-sectional view showing an LD module according to a fourth embodiment of the present invention.

As shown in FIG. 19, an LD module 40 according to this embodiment comprises a getter case 18 for accommodating a getter as moisture absorbing means. This getter case 18, which is a porous metal case, is attached to the lower surface of the cover 2c within the package 2. The getter case 18 is filled with a granular or powder getter such as silica gel for absorbing moisture to limit the amount of moisture in the package 2 to 100000 ppm by volume or less. Alternatively, the getter case 18 may be attached anywhere within the package 2, for example, on the bottom plate 2a, peripheral wall 2b, and the like, as long as the arranging space is available.

Immediately after airtight sealing the package 2, the atmosphere prevailing in the package 2 is a nitrogen gas where the amount of moisture thereof is not limited. However, the moisture in the package 2 is absorbed by the getter accommodated in the getter case 18, and is limited to an amount sufficiently smaller than 100000 ppm. For this reason, when the LD module 40 is in operation, the total amount of moisture in the light path extending from the LD device 5a to the incident end of the optical fiber 8b is limited to 100000 ppm by volume or less.

Next, a description will be given of a method of manufacturing the LD module 40 configured as described above.

A process of manufacturing the LD module 40 is substantially similar to the first embodiment except that a step of attaching the getter case 18 accommodating the getter on the lower surface of the cover 2c is added, and that the atmosphere in which the package 2 is hermetically sealed, is not a particularly dried nitrogen gas. In other words, in a general nitrogen gas atmosphere where the amount of moisture is not particularly limited, the cover 2a is mounted on the peripheral wall 2b of the package 2 for airtight sealing. Also, the gap between the flange 2d and the fixing member 46, and the gap between the fixing member 46 and the ferrule 46a are hermetically sealed by laser welding.

Alternatively, a variety of airtight sealing methods introduced in the first embodiment using FIGS. 3 to 7 and the like can of course be employed individually or in combination instead of the laser welding based airtight sealing as described above.

In the LD module 40 thus assembled, the LD device 5a for emitting the laser light with the center wavelength in a range of 1300 to 1440 nm, is accommodated in the package 2, and the spatial propagation path extending from the LD device 5a to the incident end of the optical fiber 46b is hermetically sealed by the package 2. Then, the amount of moisture in the package 2 is not necessarily limited to 100000 ppm by volume or less, immediately after the assembly.

However, the moisture in the package 2 is subsequently absorbed by the getter accommodated in the getter case 18, so that the moisture is limited to an amount sufficiently smaller than 100000 ppm by volume when the LD module 40 is in operation. Therefore, a total of the amount of moisture in the package 2 and the amount of moisture contained in the optical elements (first lens 12, light isolator 16, hermetic window 9, and second lens 7a) is limited to 100000 ppm by volume or less.

When the optical characteristics of the LD module 40 manufactured as described above are measured, substantially similar results to those of the first embodiment were obtained. Therefore, this embodiment can also provide substantially similar advantages to the first embodiment, and realize the LD module 40 that can emit laser light with the center wavelength in a range of 1300 to 1440 nm stably from the LD device 5a.

Fifth Embodiment

An LD module in this embodiment is configured in a substantially similar manner to the LD module 35 according to the third embodiment, and partially has the same components as the LD module 40 according to the fourth embodiment. Thus, the same components as those of the LD modules 35, 40 are designated the same reference numerals in the drawings and description to omit the redundant description.

As shown in FIG. 20, an LD module 45 according to this embodiment comprises a getter case 18 for accommodating getter as a moisture absorbing means on the lower surface of the cover 2c within the package 2 of the LD module 35. Also, the package 22 immediately after airtight sealing is filled with a nitrogen gas which is not limited in the amount of moisture.

Since a method of manufacturing the LD module 45 configured as described above is a combination of the methods of manufacturing the LD modules 35, 40 according to the third and fourth embodiments, description thereon will be omitted.

As described above, in the LD module 45, the amount of moisture in the package 2 immediately after assembly is not necessarily limited to 100000 ppm by volume or less. However, since the moisture in the package 2 is absorbed by the getter accommodated in the getter case 18, the total of the amount of moisture in the package 2 and the amount of moisture contained in the optical elements (first lens 12, light isolator 17, and second lens 19a) is limited to 100000 ppm by volume or less when the LD module 45 is in operation.

When the optical characteristics of the LD module 45 according to this embodiment are measured, substantially similar results to those of the first embodiment were obtained. Therefore, this embodiment can also realize the LD module 45 that can emit laser light with the center wavelength in a range of 1300 to 1440 nm stably from the LD device 5a.

In comparison of the LD module 45 according to this embodiment with the LD module 40 in the fourth embodiment, the following difference is found. Specifically, in the LD module 40, the spatial propagation path for laser light within the package 2 is divided by the hermetic window 9, so that moisture in spaces between the hermetic window 9 and the second lens 7a and between the second lens 7a and the ferrule 8a is not absorbed by the getter accommodated in the getter case 18. Therefore, there is a possibility that the amount of moisture in some part of the spatial propagation path for laser light may not be limited to 100000 ppm by volume or less.

On the other hand, in the LD module 45, as is clear from FIG. 20, moisture is absorbed by the getter accommodated in the getter case 18 over the entire spatial propagation path for laser light from the LD device 5a to the optical fiber 46b since the one end of the ferrule 46a is located in the package 2, so that the amount of moisture is limited to 100000 ppm by volume or less. In this respect, the LD module 45 is preferred to the LD module 40.

Sixth Embodiment

An LD module in this embodiment is configured in a substantially similar manner to the LD module 20 according to the second embodiment, and partially has the same components as the LD module 40 according to the fourth embodiment. Thus, the same components as those of the LD modules 20 and 40 are designated the same reference numerals in the drawings and description to omit the redundant description.

As shown in FIG. 21, an LD module 47 according to this embodiment comprises a getter case 18 for accommodating a getter as a moisture absorbing means on the lower surface of a lid 21b of a package 21 of the LD module 47. Also, the package 21 immediately after airtight sealing is filled with a nitrogen gas which is not limited in the amount of moisture.

Since a method of manufacturing the LD module 47 configured as described above is a combination of the methods of manufacturing the LD modules 20 and 40 according to the second and fourth embodiments, description thereon will be omitted.

As described above, in the LD module 47, the amount of moisture in the package 21 immediately after assembly is not necessarily limited to 100000 ppm by volume or less. However, since the moisture in the package 21 is absorbed by the getter accommodated in the getter case 18, a total of the amount of moisture in the package 21 which airtight seals the light path extending from an LD device 26 to a lens portion 32a of a lensed fiber 32 is limited to 100000 ppm by volume or less when the LD module 47 is in operation.

When the optical characteristics of the LD module 47 according to this embodiment are measured, substantially similar results to those of the first embodiment were obtained. Therefore, this embodiment can also realize the LD module 47 that can emit laser light with the center wavelength in a range of 1300 to 1440 nm stably from the LD device 26.

While the light isolators 16,17 are provided in the first and third through fifth embodiments, the light isolator need not be provided depending on the type of LD module. FBG (Fiber Bragg Grating) for selecting a wavelength of the laser light may be formed in the optical fiber 32.

Also, in the fourth through sixth embodiments, the packages 2 and 21 are filled with a nitrogen gas which is not limited in moisture when the LD modules 40, 45 and 47 are assembled, but, a nitrogen gas with the amount of moisture limited to 100000 ppm by volume or less is preferably filled as is the case with the first through third embodiments. In this case, improvements in the long-term reliability and the like can be made.

Similarly, materials which contain a least possible amount of moisture, or no moisture are preferably used for the optical elements disposed halfway on the light path for laser light within the packages 2 and 21, such as the first lens 12, light isolators 16 and 17, hermetic window 9, second lenses 7a and 19a, and the like.

Seventh Embodiment

The inventors made the following experiments using the LD module 1 according to the first embodiment.

Specifically, as shown in FIGS. 22A and 22B, the LD module 1 and a measuring device 52 are placed in a sealed box 51 of experiment devices 50 and 55. Here, the LD module 1 has the LD device 5a for emitting laser light with the center wavelength of approximately 1495 nm. The amount of moisture in the package 2 for airtight sealing the light path extending from the LD device 5a to the optical fiber 8b is limited to 100000 ppm by volume or less. A material which contains a least possible amount of moisture is selectively used for the optical fiber 8b. The measuring device 52 measures the optical output characteristic quantum efficiency characteristic, and like, of the LD module 1.

In one of the experiment devices 50, the emitting end of the optical fiber 8b extending from the LD module 1 is connected to the measuring device 52. In the other experiment device 55, an optical fiber having FBG (fiber Bragg grating) 8c formed in a core (not shown) thereof is used as the optical fiber 8b. The emitting end of the optical fiber 8b is connected to the measuring device 52. The FBG 8c forms an external resonator structure for feeding laser light emitted from the LD module 1 back again to the LD module 1.

The two types of experiment devices each 50 and 55 were provided with the sealed box 51 filled with a nitrogen gas at the standard atmospheric pressure with the amount of moisture limited to 2750 ppm by volume or less, and with the sealed box 51 filled with a nitrogen gas at the standard atmospheric pressure with the amount of moisture equal to or more than 250000 ppm by volume for measuring the light power characteristic, quantum efficiency characteristic, and so on, of LD module 1.

Figure 23A:
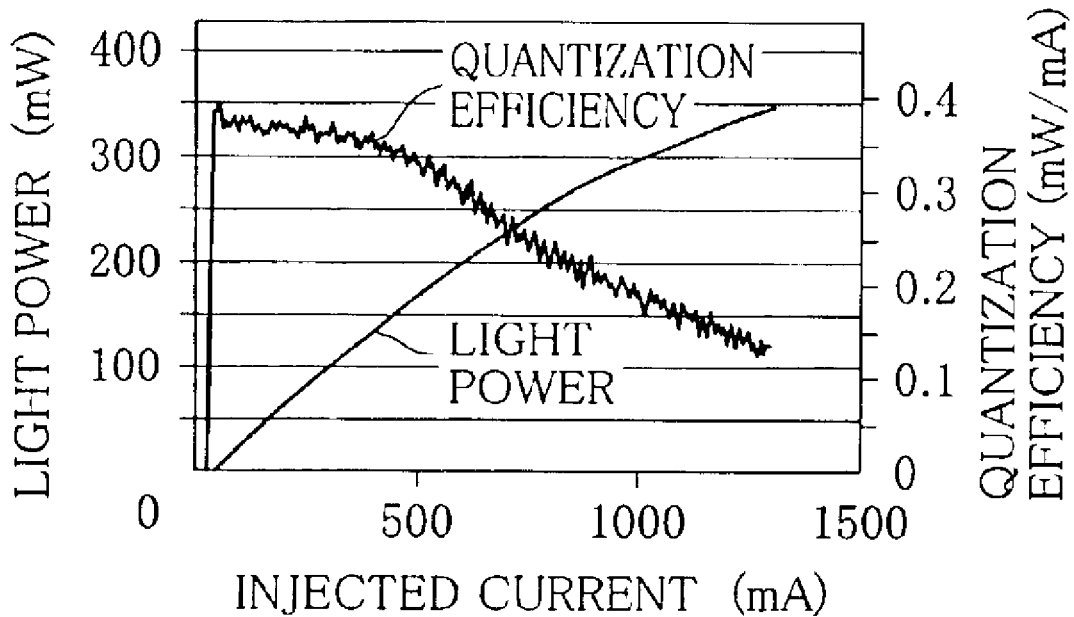
FIGS. 23A and 23B are graphs showing the light power characteristic and quantum efficiency characteristic of the laser light measured by the experiment device in FIG. 22A when the amount of moisture in the light path was limited and was not limited, respectively.
Figure 23B:
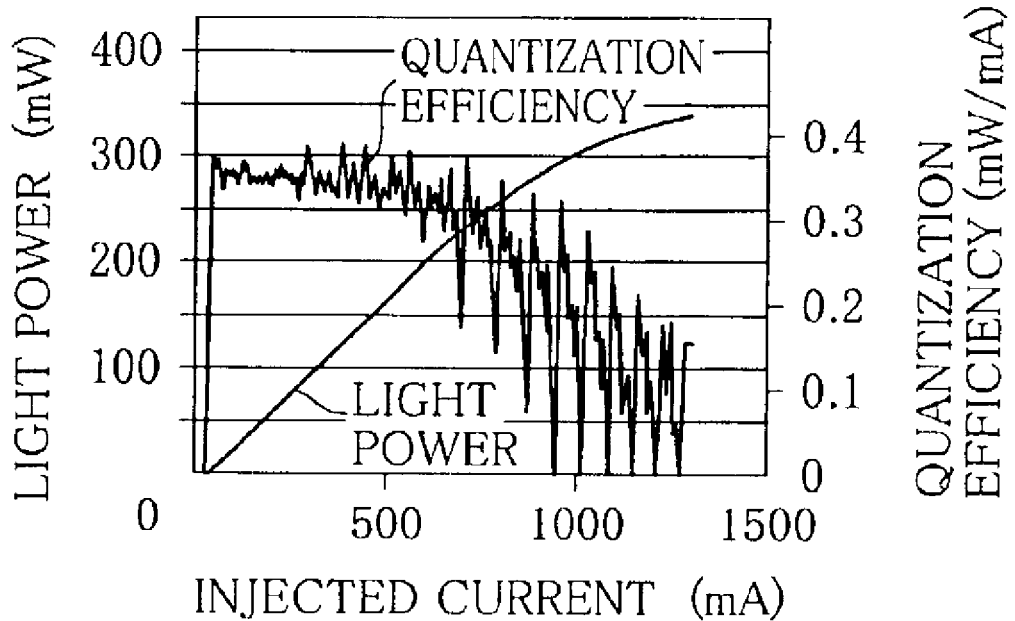
Figure 24A:
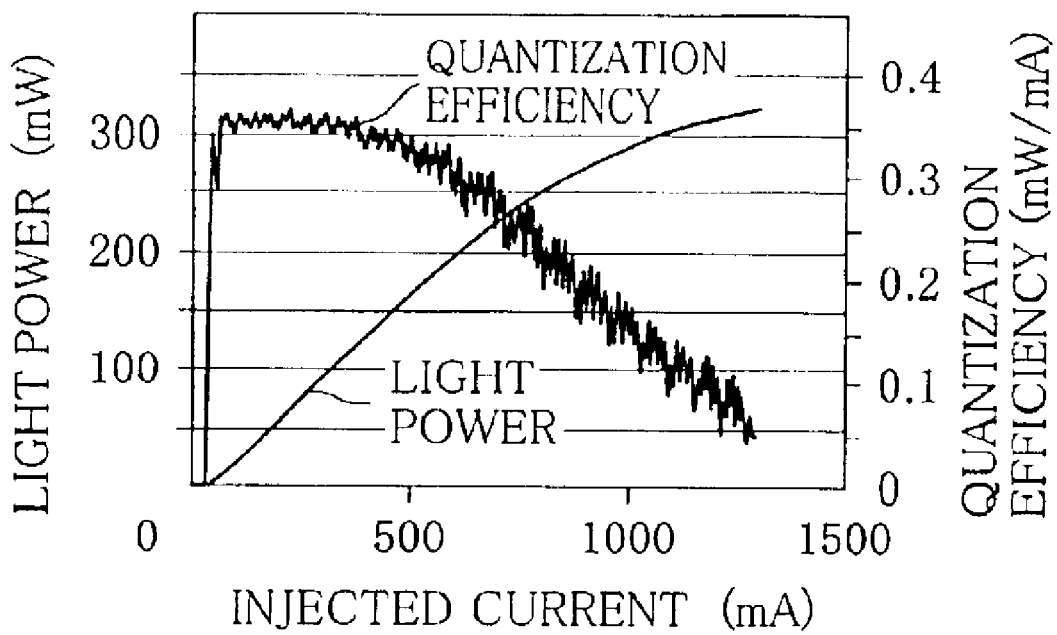
FIGS. 24A and 24B are graphs showing the light power characteristic and quantum efficiency characteristic of the laser light measured by the experiment device in FIG. 22B when the amount of moisture in the light path was limited and was not limited, respectively.
Figure 24B:
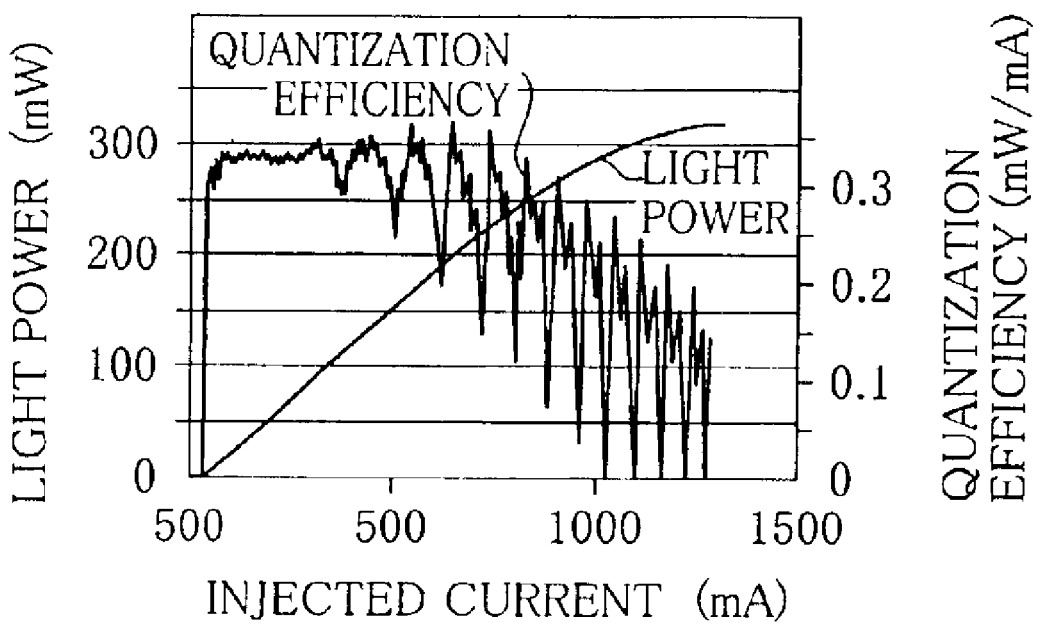

The results of the experiments are shown in FIGS. 23A to 23B and FIGS. 24A to 24B. FIG. 23A shows the results of the experiments with the experiment device 50 having the sealed box 51 with a limited amount of moisture; and FIG. 23B shows the results of the experiments with the experiment device 50 having the sealed box 51 with an unlimited amount of moisture. Similarly, FIG. 24A shows the results of the experiments which were made with the experiment device 54 having the sealed box 51 with a limited amount of moisture; and FIG. 24B shows the results of the experiments which were made with the experiment device 55 having the sealed box 51 with an unlimited amount of moisture.

In any of the results shown in FIGS. 23A to 23B and FIGS. 24A to 24B, the amount of moisture in the light path of laser light in the LD module 1 and the optical fiber 8b is limited to 100000 ppm by volume or less. On the other hand, the amount of moisture in the measuring devices 51 and 52 is limited to 2750 ppm by volume or less in the cases shown in FIGS. 23A and 24A, and exceeds 250000 ppm by volume in the cases shown in FIGS. 23B and 24B. Here, the moisture in the light path in the measuring devices 51 and 52 refers to moisture contained in the space through which the laser light propagates within the measuring devices 51 and 52, i.e., the spatial propagation path.

The following is apparent from the results shown in FIGS. 23A, 23B, 24A and 24B. Specifically, when the amount of moisture is limited in the LD module 1 and optical fiber 8b for emitting laser light, and the amount of moisture is limited in the light path in the measuring devices 51 and 52, the LD module 1 exhibits fairly stable optical output characteristic and quantum efficiency characteristic, as measured, irrespective of the presence or absence of the FBG 8c. However, even if the amount of moisture is limited in the light path in the LD module 1 and optical fiber 8b, the measured characteristics are unstable, for example, with a very large kink found on the characteristic curve of the quantum efficiency characteristic, irrespective of the presence or absence of the FBG 8c, unless the amount of moisture is limited in the light path in the measuring devices 51 and 52.

Thus, correct measurements cannot be made for the optical characteristics of laser light using a measuring system in which moisture in a normal atmosphere exists in the light path.

The inventors, therefore, devised the following measuring apparatus.

Figure 25:
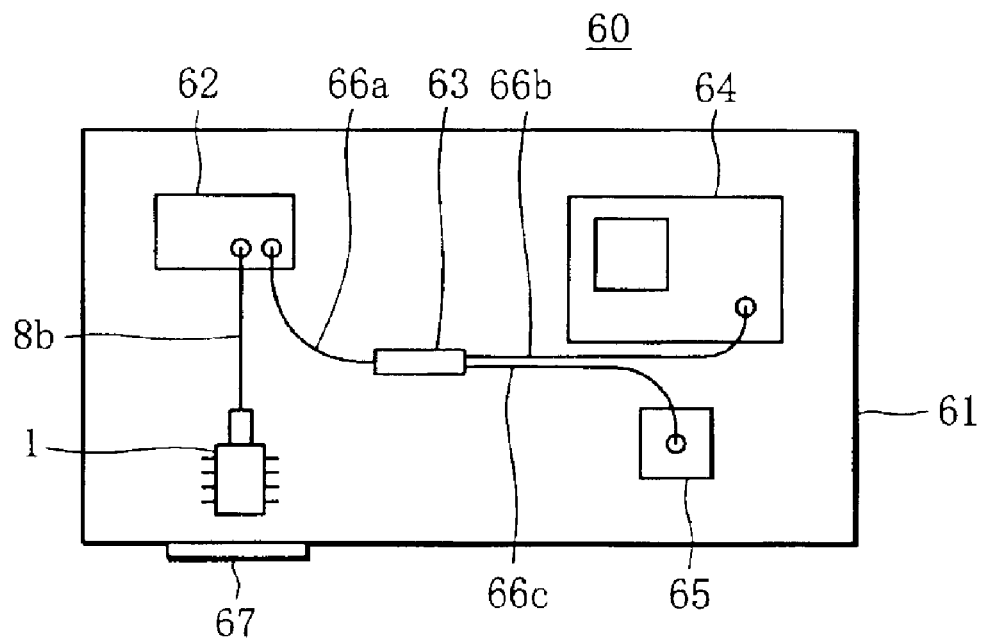
FIG. 25 is a schematic diagram showing an optical measuring apparatus according to a seventh embodiment of the present invention.

As shown in FIG. 25, an optical measuring apparatus 60 according to this embodiment comprises a hermetically sealed main container 61. The main container 61 contains a light attenuator 62 for attenuating laser light, a −3 dB coupler 63 for splitting laser light, an optical spectrum analyzer 64 for measuring the spectrum of laser light, a PD light receiver 65 for measuring the power of laser light, and the like. The optical attenuator 62 and the −3 dB coupler 63, the −3 dB coupler 63 and the optical spectrum analyzer 64, and the −3 dB coupler and the PD light receiver 65 are optically connected through optical fibers 66a, 66b, and 66c, respectively.

The optical spectrum analyzer 64 and PD light receiver 65 are measuring devices for measuring the optical characteristics of laser light emitted from the LD module 1 as a measuring target. The light attenuator 62, −3 dB coupler 63, and optical fibers 66a, 66b and 66c are disposed halfway on a light path extending from the LD module 1 to the optical spectrum analyzer 64 and PD light receiver 65 and function as intermediate optical elements for attenuating, splitting, and guiding the laser light. The light attenuator 62 as an intermediate optical element, and the optical spectrum analyzer 64 and PD light receiver 65 as measuring devices each have internal spatial propagation paths for laser light to spatially propagate therethrough.

The main container 61 is also provided with an inlet/outlet port 67 for introducing the LD module 1 from the outside and removing the LD module 1 from the main container 61. The inlet/outlet port 67 is provided with a door (not shown) which can be opened and closed, such that the airtightness within the main container 61 is ensured when the door is closed.

For an actual measurement, the emitting end of the optical fiber 8b extending from the LD module 1 introduced into the main container 61 is optically connected to the light attenuator 62, and the main container 61 is hermetically sealed. The main container 61 is filled with a nitrogen gas at the standard atmospheric pressure with the amount of moisture limited to 100000 ppm by volume or less.

Next, a description will be given of an optical measuring method for measuring the optical characteristics of the LD module 1 using the optical measuring apparatus 60 configured as described above.

First, the LD module 1 is introduced into the main container 61 through the inlet/outlet port 67, and the emitting end of the optical fiber 8b extending from the LD module 1 is optically connected to the light attenuator 62. An easily detachable connector is used for connecting the optical fiber 8b to the light attenuator 62. This facilitates the connection of the emitting end of the optical fiber 8b to the light attenuator 62, and disconnection of the optical fiber 8b from the light attenuator 62.

Next, the door of the inlet/outlet port 67 is closed, and the main container 61 is filled with a dried nitrogen gas at the standard atmospheric pressure with the amount of moisture limited, for example, to a value lower than 100000 ppm by volume for airtight sealing. As a result, the amount of moisture in the spatial propagation path for laser light inside the light attenuator 62, optical spectrum analyzer 64, and PD light receiver 65 is limited to 100000 ppm by volume or less.

For airtight sealing the main container 61 with a dried nitrogen gas with the amount of moisture limited to 100000 ppm by volume or less, a predetermined gas system may be additionally provided for the main container 61. Specifically, after the LD module 1 is introduced into the main container 61, the door of the inlet/outlet port 67 is closed, and the dried nitrogen gas at the standard atmospheric pressure with the amount of moisture limited to a value lower than 100000 ppm by volume or less is introduced from the gas system into the main container 61 to replace the atmosphere within the main container 61. Alternatively, a dry room may be provided in a portion of a gas system for supplying a normal nitrogen gas to heat the nitrogen gas for drying, and the dried nitrogen gas with the amount of moisture reduced to a value lower than 100000 ppm by volume may be introduced into the main container 61. Further alternatively, the main container 61 may be placed in a dry nitrogen gas atmosphere with the amount of moisture limited a value lower than 100000 ppm by volume, and the LD module 1 may be introduced into the main container 61 in this atmosphere to airtight seal the main container 61 in this state.

Next, laser light is emitted from the LD module 1. This laser light is guided by the optical fibers 8b, 66a, 66b and 66c, and in this process, is attenuated by the light attenuator 62, and split by the −3 dB coupler 63. Then, the laser light is input to the optical spectrum analyzer 64 and PD light receiver 65 which measure the optical characteristics of the laser light. Upon termination of measurements, the emitting end of the optical fiber 8b is removed from the light attenuator 62, and the door of the inlet/outlet port 67 is opened. Then, the LD module 1 is removed from the main container 61 to the outside.

Figure 26:
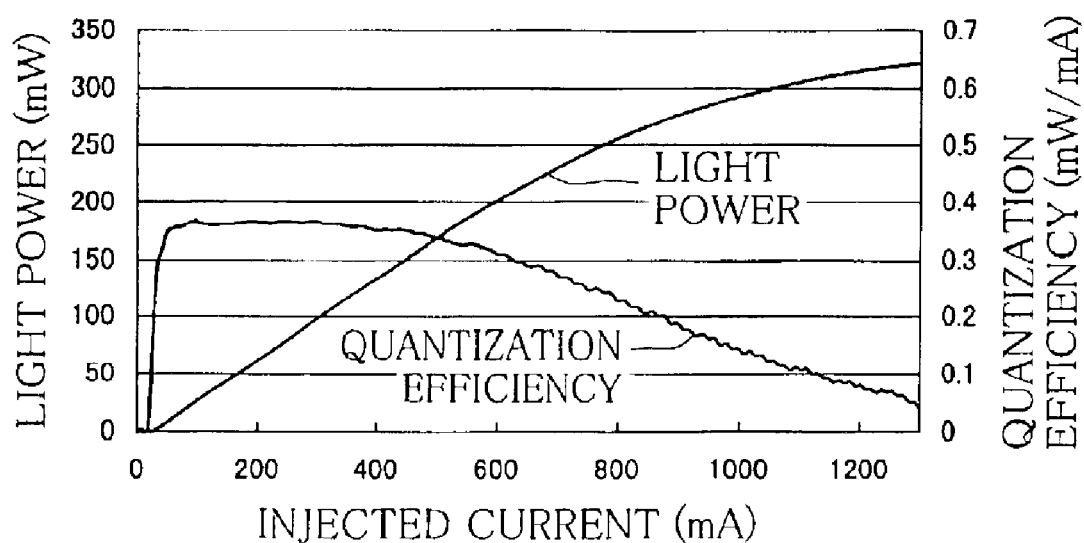
FIG. 26 is a graph showing the light power characteristic and quantum efficiency of the laser light measured by the optical measuring apparatus in FIG. 25.

The results of measuring the optical characteristics of the LD module 1 are shown in FIG. 26. Further, for comparison, the results of measuring the optical characteristics of the LD module 1 with the main container 61 filled with the ordinary atmosphere, in other words, the results of measurements made in the ordinary atmosphere without using the main container are also shown in FIG. 27.

Figure 27:
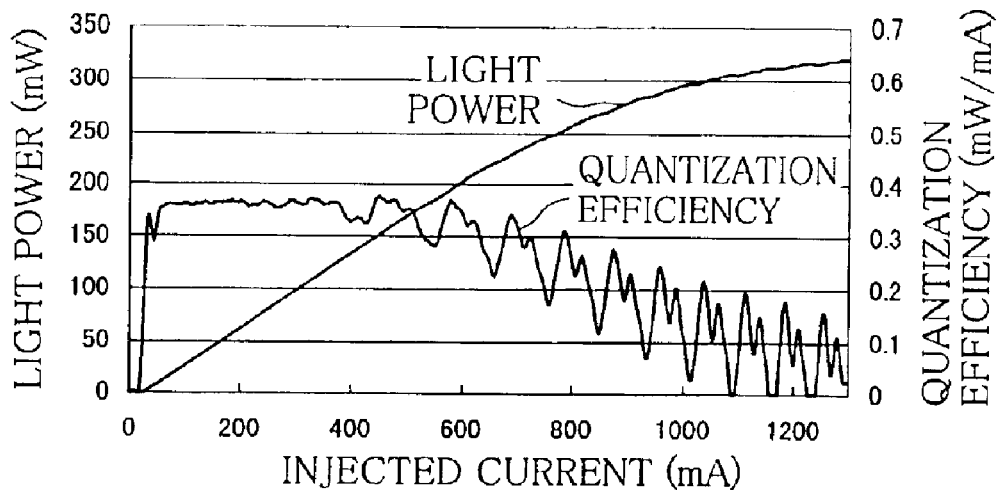
FIG. 27 is a graph showing the light power characteristic and quantum efficiency of the laser light measured by an optical measuring apparatus for purposes of comparison with the optical measuring apparatus in FIG. 25.

The following is apparent from the results shown in FIGS. 26 and 27. Specifically, when the light attenuator 62, −3 dB coupler 63, optical spectrum analyzer 64, and PD light receiver 65 are hermetically sealed within the main container 61 with the amount of moisture limited to 100000 ppm by volume or less, it is possible to avoid a very large kink on the characteristic curve of the quantum efficiency characteristic, which would be encountered in measurements in the ordinary atmosphere.

As described above, according to this embodiment, since the light attenuator 62, −3 dB coupler 63, optical spectrum analyzer 64, and PD light receiver 65 are hermetically sealed within the main container 61 in which the amount of moisture is limited to a value lower than 100000 ppm by volume, the amount of moisture is also limited to 100000 ppm by volume or less in the spatial propagation path within the light attenuator 62, optical spectrum analyzer 64, and PD light receiver 65 of the light path for laser light emitted from the LD module 1. As a result, the laser light is hardly affected by absorption or the like by the moisture. It is therefore possible to stably and precisely measure the optical characteristics of the LD module 1.

Eighth Embodiment

An optical measuring apparatus in this embodiment is configured in a substantially similar manner to the optical measuring apparatus 60 according to the seventh embodiment. Therefore, the following description will be centered on components which are different from those of the optical measuring apparatus 60. The same components are designated the same reference numerals in the drawings and description to omit the redundant description.

Figure 28:
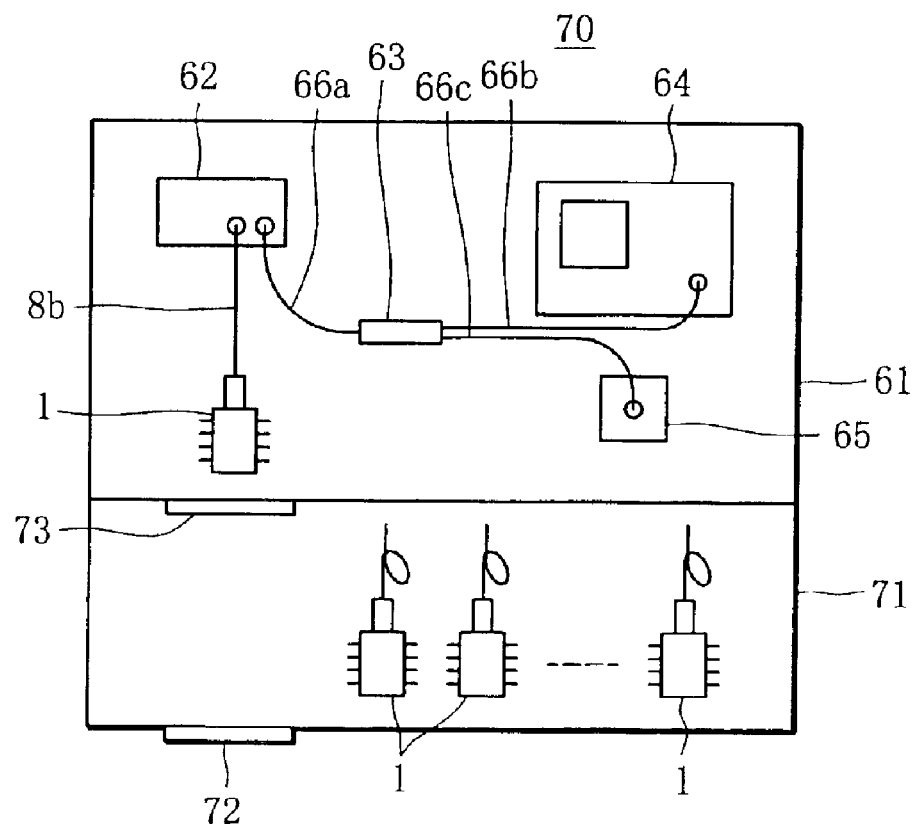
FIG. 28 is a schematic diagram showing an optical measuring apparatus according to an eighth embodiment of the present invention.

As shown in FIG. 28, an optical measuring apparatus 70 according to this embodiment comprises a hermetic sub container 71 adjacent to the main container 61. The sub container 71 is provided with an inlet/outlet port 72 for introducing an LD module 1 from the outside and taking out the LD module 1 to the outside. The sub container 71 can simultaneously accommodate a plurality of LD modules 1 in one lot. A transfer port 73 is provided between the sub container 71 and the main container 61 for transferring the LD module 1 from one to the other. The inlet/outlet port 72 and transfer port 73 are respectively provided with doors (not shown) which can be opened and closed.

Next, a description will be given of an optical measuring method for measuring the optical characteristics of the LD module using the optical measuring apparatus 70 configured as described above.

First, the door of the transfer port 73 is closed, and the main container 61 is filled with a dried nitrogen gas at the standard atmospheric pressure with the amount of moisture limited, for example, to a value lower than 100000 ppm volume to airtight seal the main container 61. After one lot of LD modules 1 are introduced into the sub container 71 through the inlet/outlet port 72, the door of the inlet/outlet port 72 is closed. Then, the sub container 71 is filled with a dried nitrogen gas at the standard atmospheric pressure with the amount of moisture limited, for example, to a value lower than 100000 ppm by volume to airtight seal the sub container 71.

Next, the door of the transfer port 73 is opened to transfer one of the LD modules 1 within the sub container 71 into the main container 61, with the main container 61 and sub container 71 each maintained in the airtight state, and the emitting end of the optical fiber 8b extending from the LD module 1 is optically connected to the light attenuator 62.

Subsequently, in a procedure similar to that in the seventh embodiment, the optical characteristics of laser light emitted from the LD module 1 are measured by the optical spectrum analyzer 64 and PD light receiver 65. Upon termination of measurements, the emitting end of the optical fiber 8b is removed from the light attenuator 62, and the measured LD module 1 is transferred back from the main container 61 to the sub container 71. Then, another LD module 1 is transferred from the sub container 71 to the main container 61 for the next measurement.

After all the LD modules 1 in one lot have been measured and the last LD module is transferred back from the main container 61 to the sub container 71, the door of the transfer port 73 is closed. Then, the door of the inlet/outlet port 72 is opened to remove the measured LD modules 1 in one lot through the sub container 71 to the outside.

As described above, in this embodiment, a plurality of LD modules 1 are accommodated in the sub container 71, and one LD module 1 to be measured is transferred from the sub container 71 to the main container 61, with the main container 61 and sub container 71 each maintained in the airtight state, to measure the optical characteristics of the LD module 1. Therefore, the main container 61 is required to be airtight sealed only once using the dried nitrogen gas with a limited amount of moisture, as described above, and there is no need to conduct airtight sealing operation for each of measurements on a plurality of LD modules 1. Instead, the sub container 71, which has a smaller volume than the main container 61, may be airtight sealed with the dried nitrogen gas only once for a plurality of measurements corresponding to the number of LD modules 1 in one lot accommodated in the sub container 71. It is therefore possible to realize a reduced cost and a higher efficiency of measurement operations resulting from the saving of dried nitrogen gas and a reduced number of airtight sealing operations, in addition to the advantages produced by the seventh embodiment.

Alternatively, in the foregoing embodiment, the sub container 71 may be separated from the main container 61 and made movable. In this case, the transfer port 73 is provided with two doors for the main container 61 and the sub container 71, such that the main container 61 and sub container 71 can maintain the sealability even when the sub container 71 and the main container 61 are separated from each other. According to such an exemplary modification, a plurality of sub containers 71 may be provided, such that one sub container 71 is connected to the main container 61 for measuring the LD modules 1 in one lot, while another one lot of LD modules 1 is introduced into another sub container 71 simultaneously in a different place, and the sub container 71 is hermetically sealed using a dried nitrogen gas with the amount of moisture limited to a value lower than 100000 ppm by volume. It is therefore possible to further improve the efficiency of the measurement operation.

Ninth Embodiment

An optical measuring apparatus in this embodiment is configured substantially in a similar manner to the optical measuring apparatus 60 according to the seventh embodiment. Therefore, the following description will be centered on components which are different from those of the optical measuring apparatus 60. The same components are designated the same reference numerals in the drawings and description to omit the redundant description.

Figure 29:
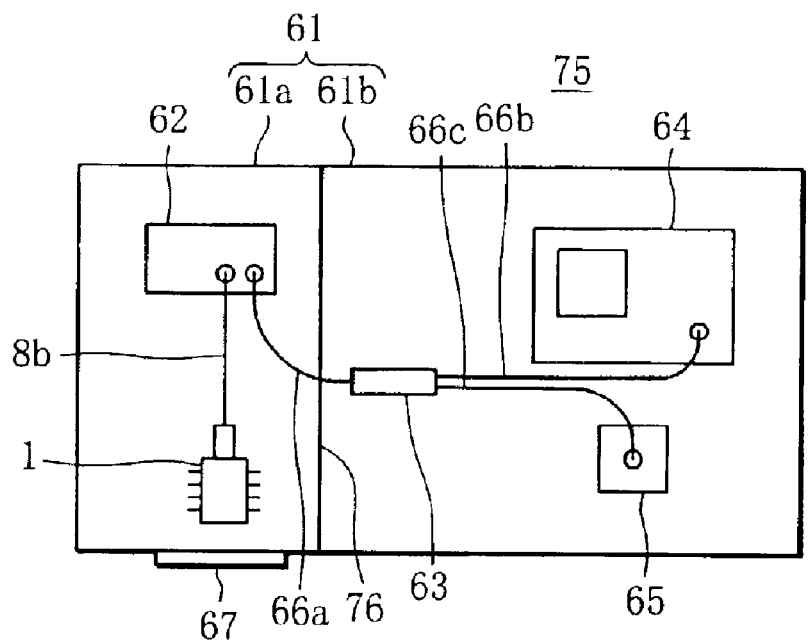
FIG. 29 is a schematic diagram showing an optical measuring apparatus according to a ninth embodiment of the present invention.

As shown in FIG. 29, an optical measuring apparatus 75 according to this embodiment comprises a hermetic wall 76 within the main container 61 for dividing the main container 61 into a first chamber 61a and a second chamber 61b. The first chamber 61a accommodates the light attenuator 62 which is a first intermediate optical element optically connected to the emitting end of an optical fiber 8b extending from an LD module 1 to be measured. The second chamber 61b accommodates the −3 dB coupler 63 which is another intermediate optical element, and the optical spectrum analyzer 64 and PD light receiver 65 which are measuring devices. The first chamber 61a is provided with the inlet/outlet port 67.

Next, a description will be given of an optical measuring method for measuring the optical characteristics of the LD module 1 using the optical measuring apparatus 75 configured as described above.

First, the second chamber 61b is filled with a dried nitrogen gas at the standard atmospheric pressure with the amount of moisture limited, for example, to a value lower than 100000 ppm by volume to hermetically seal the second chamber 61. Subsequently, the LD module 1 is introduced into the first chamber 61a through the inlet/outlet port 67, and the emitting end of the optical fiber 8b extending from the LD module 1 is optically connected to the light attenuator 62. Then, the door of the inlet/outlet port 67 is closed, and the first chamber 61a is filled with a dried nitrogen gas at the standard atmospheric pressure with the amount of moisture limited to a value lower than 100000 ppm by volume for airtight sealing.

Subsequent to this, the optical characteristics of laser light emitted from the LD module 1 are measured by the optical spectrum analyzer 64 and PD light receiver 65 in a procedure similar to that in the seventh embodiment. Upon termination of measurements, the emitting end of the optical fiber 8b is removed from the light attenuator 62, and the door of the inlet/outlet port 67 is opened to remove the LD module 1 from the first chamber 61a to the outside.

As described above, according to this embodiment, since the main container 61 is divided by the hermetic wall 76 into the first chamber 61a and second chamber 61b, the second chamber 61b, which accommodates the optical spectrum analyzer 64 and PD light receiver 65, need be hermetically sealed only once under the aforementioned predetermined condition, thus eliminating the need for airtight sealing each time a different LD module 1 is measured. Instead, the first chamber 61a which accommodates the light attenuator 62 which is the first intermediate optical element optically connected directly to the emitting end of the optical fiber 8b extending from the introduced LD module 1 may be hermetically sealed for each measurement under the aforementioned predetermined condition. Therefore, a reduction in cost and the like resulting from saving of dried nitrogen gas can be realized in addition to the advantages of the seventh embodiment.

Tenth Embodiment

An optical measuring apparatus in this embodiment is configured in a substantially similar manner to the optical measuring apparatus 60 according to the seventh embodiment. Therefore, the following description will be centered on components which are different from those of the optical measuring apparatus 60. The same components are designated the same reference numerals in the drawings and description to omit redundant description.

Figure 30:
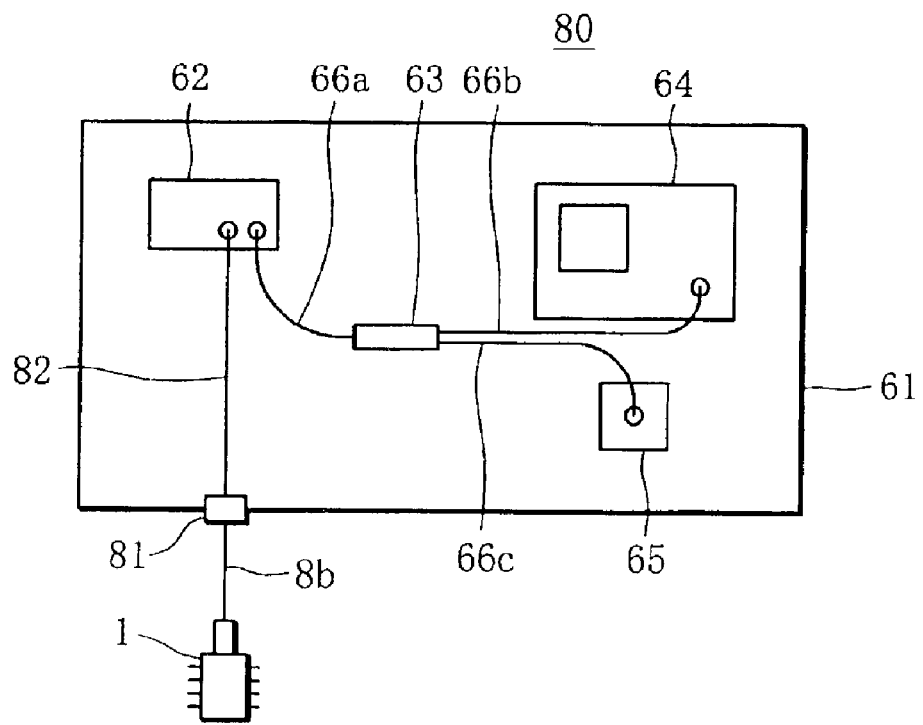
FIG. 30 is a schematic diagram showing an optical measuring apparatus according to a tenth embodiment of the present invention.

As shown in FIG. 30, an optical measuring apparatus 80 according to this embodiment comprises an optical connector 81 on an outer wall of the main container 61. The light attenuator 62 within the main container 61 is connected to one side of the optical connector 81 through an optical fiber 82. The emitting end of the optical fiber 8b extending from the LD module 1 to be measured placed outside the main container 61 is connected to the other side of the optical connector 81. Since a easily detachable connector is used for the connection of the optical fiber 8b to the optical connector 81, this can facilitate the connection of the emitting end of the optical fiber 8b to the optical connector 81, and removal of the optical fiber 8b from the optical connector 81.

Next, a description will be made on an optical measuring method for measuring the optical characteristic of the LD module 1 using the optical measuring apparatus 80 configured as described above.

First, the main container 61 is filled with a dried nitrogen gas at the standard atmospheric pressure with the amount of moisture limited to a value lower than 100000 ppm by volume to hermetically seal the main container 61. Subsequently, the emitting end of the optical fiber 8b extending from the LD module 1 is optically connected to the optical connector 81.

Subsequent to this, the light spectrum, light power and the like of laser light emitted from the LD module 1 are measured by the optical spectrum analyzer 64 and PD light receiver 65 in a procedure similar to that in the seventh embodiment. Upon termination of measurements, the emitting end of the optical fiber 8b is removed from the optical connector 81.

As described above, this embodiment provides the following advantages in addition to those of the seventh embodiment. Specifically, since the emitting end of the optical fiber 8b extending from the LD module 1 can be connected to the optical connector 81 from the outside of the main container 61, eliminating the need to introduce the LD module 1 into the main container 61 and facilitating the connection of the emitting end of the optical fiber 8b easy as well. Also, the main container 61 need to be hermetically sealed only once under the aforementioned predetermined condition, thereby eliminating the need for airtight sealing for each measurement. It is therefore possible to realize highly efficient measuring operations and a reduction in cost and the like resulting from substantial saving of dried nitrogen gas.

Also, since the LD module 1 need not be introduced into the main container 61, the space can be correspondingly saved, thereby realizing a reduction in the size of the optical measuring apparatus 80. Further, since an object to be measured is placed outside the main container 61, a range of objects to be measured is largely extended. Specifically, not limited to laser light emitted from optical device such as the LD module 1, the optical characteristics can be measured for laser light emitted from a large optical communication device, and laser light transmitted from a remote location.

Eleventh Embodiment

An optical measuring apparatus in this embodiment has in part the same components as the optical measuring apparatus 60 according to the seventh embodiment. Therefore, the following description will be centered on components which are different from those of the optical measuring apparatus 60. The same components are designated the same reference numerals in the drawings and description to omit redundant description.

Figure 31:
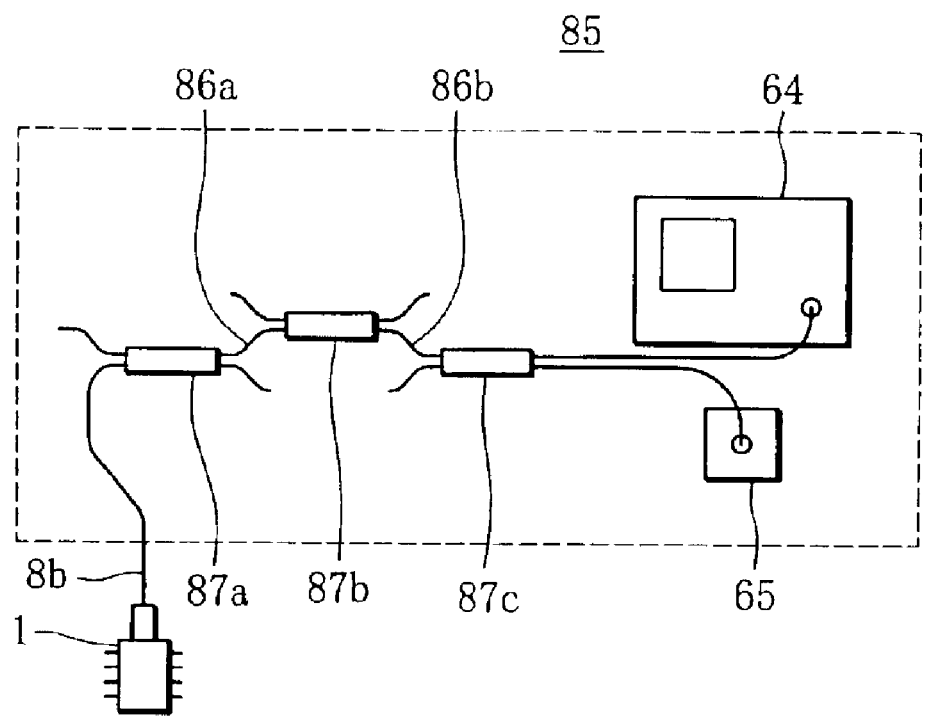
FIG. 31 is a schematic diagram showing an optical measuring apparatus according to an eleventh embodiment of the present invention.

As shown in FIG. 31, the main container 61 in the seventh embodiment is removed in an optical measuring apparatus 85 according to this embodiment. In addition, three −3 dB couplers 87a, 87b and 87c connected in sequence through optical fibers 86a and 86b are used instead of the light attenuator 62 and −3 dB coupler 63 in the seventh embodiment. Open ends of these −3 dB couplers 87a, 87b and 87c are processed to prevent reflection. Alternatively, couplers without open ends may be used instead of the couplers having the open ends processed to prevent reflection.

Next, a description will be made on an optical measuring method for measuring the optical characteristics of the LD module 1 using the optical measuring apparatus 85 configured as described above.

The emitting end of the optical fiber 8b extending from the LD module 1 to be measured is optically connected to the −3 dB coupler 87a in the ordinary atmosphere. Since a easily detachable connector is used for the connection of the optical fiber 8b to the −3 dB coupler 87a, this can facilitate the connection of the emitting end of the optical fiber 8b to the −3 dB coupler 87a, and removal of the optical fiber 8b from the −3 dB coupler 87a. Subsequent to this, the optical characteristics of laser light emitted from the LD module 1 are measured by the optical spectrum analyzer 64 and PD light receiver 65 in a procedure similar to that in the seventh embodiment.

Figure 32:
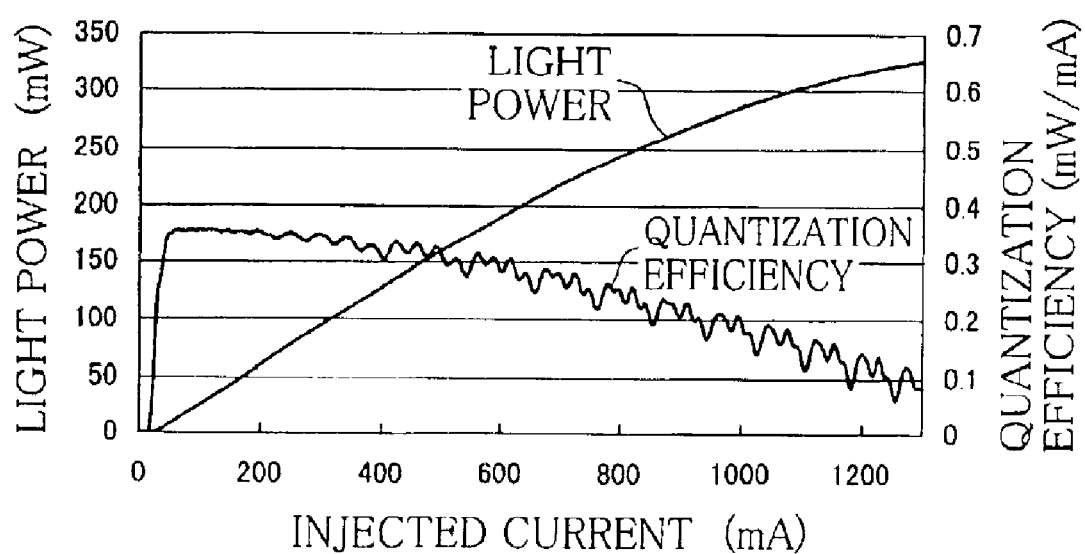
FIG. 32 is a graph showing the light power characteristic and quantum efficiency of the laser light measured by the optical measuring apparatus in FIG. 31.

The results of measuring the optical characteristics of the LD module 1 in the foregoing manner are shown in FIG. 32. As compared with FIG. 27 which show the results of measurements made in the ordinary atmosphere using the light attenuator 62, a kink of a reduced magnitude is found on the characteristic curve of the quantum efficiency characteristic. However, as compared with FIG. 26 in the first embodiment, a relatively large kink is found.

The following is apparent from the foregoing results. Specifically, by replacing an intermediate optical element (light attenuator 62) having an internal spatial propagation path with an intermediate optical element (−3 dB coupler 87a or the like) having no spatial propagation path, no spatial propagation path exists in the light path extending from the LD module 1 to the measuring devices (optical spectrum analyzer 64 and PD light receiver 65). It is therefore possible to precisely measure the optical characteristics of the LD module 1 as compared with measurements in the ordinary atmosphere using the light attenuator 62.

However, the measuring devices (optical spectrum analyzer 64 and PD light receiver 65) are placed in the ordinary atmosphere, so that moisture included in the ordinary atmosphere should exist in the spatial propagation paths within the measuring devices. As compared with the first embodiment, the kink still remains on the quantum efficiency characteristic due to the influence of the moisture which exists in the spatial propagation paths within the PD light receiver 65.

As described above, according to the foregoing embodiment, by replacing the intermediate optical elements disposed on the light path extending from the LD module 1 to the measuring devices (optical spectrum analyzer 64 and PD light receiver 65) by optical fiber based optical elements having no spatial propagation path, it is possible to improve the accuracy of measurements on the optical characteristics of the LD module. However, since the internal spatial propagation paths of the measuring devices (optical spectrum analyzer 64 and PD light receiver 65) are placed in the ordinary atmosphere, this embodiment cannot reach the level of high measuring accuracy as achieved in the first embodiment.

It is also contemplated to use an optical waveguide as the light path within the PD light receiver 65 just before the connection to the photodiode in order to shorten the spatial propagation path within the PD light receiver 65 as much as possible to reduce the influence of moisture.

Twelfth Embodiment

An optical measuring apparatus in this embodiment is configured in a substantially similar manner to the optical measuring apparatus 85 according to the eleventh embodiment. Therefore, the following description will be centered on components which are different from those of the optical measuring apparatus 85. The same components are designated the same reference numerals in the drawings and description to omit redundant description.

Figure 33:
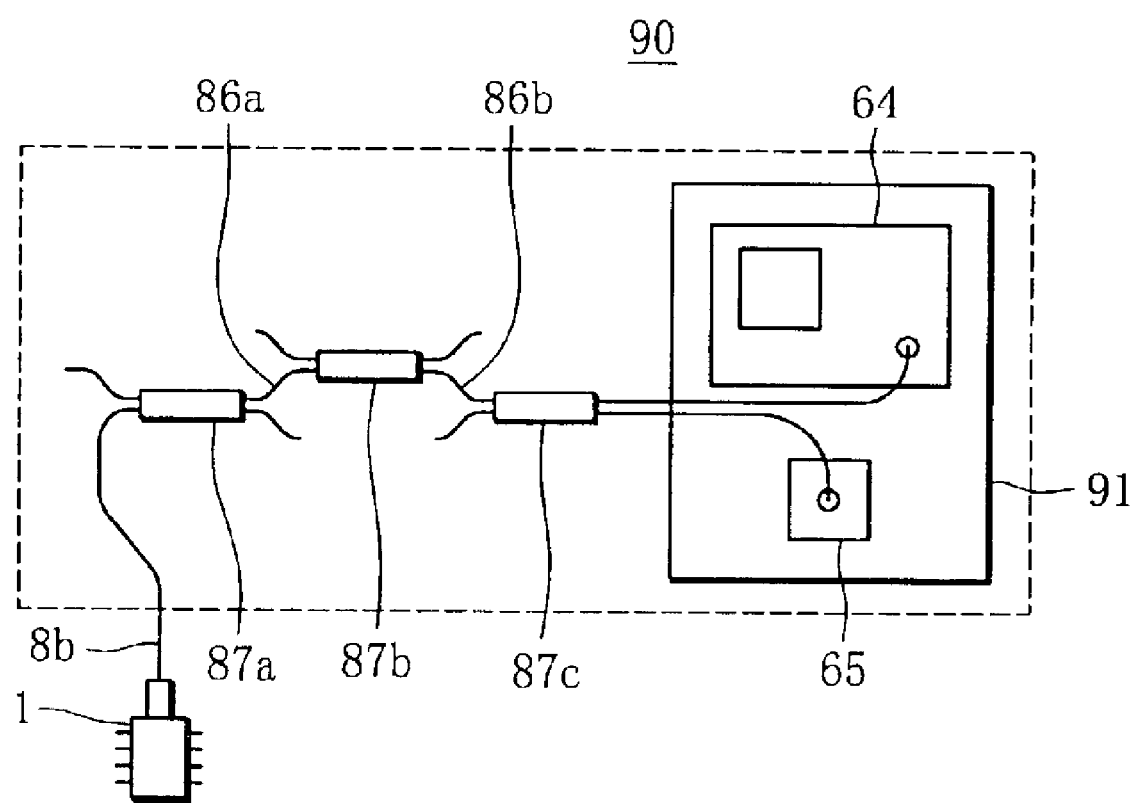
FIG. 33 is a schematic diagram showing an optical measuring apparatus according to a twelfth embodiment of the present invention.

As shown in FIG. 33, an optical measuring apparatus 90 according to this embodiment comprises a main container 91 for accommodating the optical spectrum analyzer 64 and PD light receiver 65. This main container 91 is hermetically sealed, and is filled with a dried nitrogen gas at the standard atmospheric pressure with the amount of moisture limited, for example, to a value lower than 100000 ppm by volume. Therefore, the amount of moisture is limited to 100000 ppm by volume or less in the internal spatial propagation paths of the optical spectrum analyzer 64 and PD light receiver 65.

Since an optical measuring method using the optical measuring apparatus 90 configured as described above is similar to the eleventh embodiment, description thereon will be omitted.

When the optical characteristics of the LD module 1 using the optical measuring apparatus 90 according to this embodiment are measured, substantially similar results to those of the first embodiment shown in FIG. 26 were obtained.

As described above, in this embodiment, like the eleventh embodiment, the optical fiber based optical elements, −3 dB couplers 87a, 87b and 87c, which have no spatial propagation path, are used for intermediate optical elements on the light path extending from the LD module 1 to the measuring devices. Further, the optical spectrum analyzer 64 and PD light receiver 65, functioning as measuring devices, are hermetically sealed by the main container 91 to limit the amount of moisture in the internal spatial propagation paths of the optical spectrum analyzer 64 and PD light receiver 65 to 100000 ppm by volume or less. It is therefore possible to accomplish a high measuring accuracy substantially identical to the first embodiment.

Alternatively, the optical spectrum analyzer 64 and PD light receiver 65 may be hermetically sealed, respectively, instead of accommodating the optical spectrum analyzer 64 and PD light receiver 65 in the main container 91, and filled with a dried nitrogen gas at the standard atmospheric pressure with the amount of moisture limited, for example, to a value lower than 100000 ppm by volume to limit the amount of moisture in the internal spatial propagation paths of the optical spectrum analyzer 64 and PD light receiver 65 to 100000 ppm by volume or less.

While in the seventh through twelfth embodiments, the −3 dB couplers 63, 87a to 87c are used as intermediate optical elements, the branch ratio and number of such couplers can be arbitrarily determined depending on the purpose of measurement.

In the seventh through tenth, and twelfth embodiments, when the measuring devices (optical spectrum analyzer 64 and PD light receiver 65) are enclosed in the main container 61 or 91, the temperature within the main container 61, 91 may rise due to heat generated by the measuring devices so that 1 the measuring accuracy thereof is lowered. For this reason, the main containers 61, 91 for enclosing the measuring devices is preferably provided with a device for adjusting the temperature within the main containers 61, 91.

The invention being thus described, it will be obvious that the same may be varied in many ways. Such variations are not to be regarded as a departure from the spirit and scope of the invention, and all such modification as would be obvious to one skilled in the art are intended to be including within the scope of the following claims.

What is claimed is:

1. A semiconductor laser module comprising:
   a semiconductor laser device configured to emit a laser light,
   an optical fiber configured to receive and guide the laser light emitted from said semiconductor laser device; and
   a package configured to accommodate said semiconductor laser device in a first space of said laser module and to provide an end of said optical fiber in a second space of said laser module sealed from said first space such that an airtight sealed environment for a light path for the laser light that extends at least from said semiconductor laser device in said first space to an incident end of said optical fiber in said second space, said optical fiber extending from said package,
   wherein an amount of moisture in said second space is limited to 100000 ppm by volume or less.

2. The module according to claim 1, further comprising:
   an optical element disposed in said light path within said package,
   wherein a total of the amount of moisture in said package and an amount of moisture contained in said optical element is limited to 100000 ppm by volume or less.

3. The module according to claim 1, further comprising:
   a getter disposed in said package and configured to absorb moisture.

4. The module according to claim 1, wherein:
   said package includes
      an opening portion through which said optical fiber is inserted; and
      a seal configured to hermetically seal a gap between said optical fiber and an inner wall of the opening portion of said package.

5. The module according to claim 4, wherein said seal includes at least one of an adhesive and a resin that closes the gap.

6. The module according to claim 4, wherein said seal includes solder that closes the gap.

7. The module according to claim 4, wherein said seal includes a seam that closes the gap, said seam being a laser welded seam.

8. The module according to claim 4, wherein said seal includes a covering member for airtight sealing a region between said optical fiber and said package.

9. The module according to claim 1, wherein:
   said package includes
      an opening portion through which said optical fiber is inserted; and
      sealing means for hermetically sealing a gap between said optical fiber and an inner wall of the opening portion of said package.

10. The module according to claim 9, wherein said sealing means includes means for airtight sealing a region between said optical fiber and said package.

11. The module according to claim 1, further comprising a window configured to hermetically seal said semiconductor laser device whithin said first space and to allow the laser light to pass therethrough,
   wherein said potical fiber end is disposed within said second space on an opposite side to said simiconductor laser device with respect to said window with a space between said window and said optical fiber being hermetically sealed.

12. The semincondutor laser module of claim 1, wherein the semiconductor laser device is configured to emit a laser light having a center wavelenghth in an inclusive range of 1300 nm through 1400 nm.

13. An optical measuring method comprising steps of:
   limiting an amount of moisture in a package containing a light path for a laser light to 100000 ppm by volume or less;
   emitting said laser light from an output end of an optical fiber to said light path, the input of the optical fiber being connected to a laser device; and measuring a characteristic of the laser light when the laser light exits said output end and travels in the light path.

14. The method according to claim 13, wherein:
said emitting step includes emitting said laser light through an optical element disposed in said light path within said package; and
said limiting step includes limiting a total of the amount of moisture in said package and an amount of moisture contained in said optical element to 100000 ppm by volume or less.

15. The method according to claim 13, wherein:
said limiting step includes absorbing said moisture with a getter disposed in said package.

16. The method according to claim 13, wherein:
said limiting step includes hermetically sealing a gap between said optical fiber and an inner wall of an opening portion formed in a wall of said package and through which said optical fiber is inserted.

17. The method according to claim 16, wherein said hermetically sealing step includes closing the gap with at least one of an adhesive and a resin.

18. The method according to claim 16, wherein said hermetically sealing step includes closing the gap with solder.

19. The method according to claim 16, wherein said hermetically sealing step includes laser welding a seam so as to close said gap.

20. The method according to claim 16, wherein said hermetically sealing step includes applying a covering so as to airtightly seal a region between said optical fiber and said package.

21. The optical measuring method of claim 13, wherein said emitting comprises emitting laser light having a center wavelength in an inclusive range of 1300 nm through 1440 nm.

22. An optical measuring apparatus comprising:
a measuring device configured to receive laser light, emitted from an output end of an optical fiber the input which is connected to a laser device, to measure a characteristic of said laser light, said laser light traveling along a light path; and
a main container configured to accommodate said measuring device therein and provide an airtight sealed environment for at least a spatial propagation path portion of said light path for said laser light that extends from the output end of said optical fiber to said measuring device,
wherein an amount of moisture in said main container is limited to 100000 ppm by volume or less.

23. The apparatus according to claim 22, further comprising:
an optical element disposed in said light path within said main container, said optical element having an internal spatial propagation path.

24. The apparatus according to claim 23, wherein:
said main container includes a first chamber that accommodates said measuring device, and a second chamber that accommodates said optical element,
said second chamber comprises an inlet/outlet port configured to introduce said optical fiber and a semiconductor laser module that emits said laser light to said optical fiber into said second chamber,
said inlet/output port is configured to remain airtightly closed when said optical fiber and said semiconductor laser module are in said second chamber.

25. The apparatus according to claim 22, wherein:
said main container comprises an inlet/outlet port configured to introduce said optical fiber and a semiconductor laser module configured to emit said laser light to said optical fiber therein;
said inlet/outlet port being configured to remain airtightly closed wherein said optical fiber and said semiconductor laser module are in said main container.

26. The apparatus according to claim 22, wherein said apparatus further comprises:
a sub container including a transfer port configured to connect said sub container to said main container; and
an inlet/outlet port configured to introduce into said sub container said optical fiber and a semiconductor laser module that emits said laser light to said optical fiber, wherein
said inlet/output port and said transfer being configured to remain airtightly closed when said optical fiber and said semiconductor laser module are into said sub container,
said optical fiber and said semiconductor laser module are accommodated in said sub container with an amount of moisture in said sub container being limited to 100000 ppm by volume or less.

27. The apparatus according to claim 22, wherein said main container comprises an optical connection configured to removably connect the output end of said optical fiber from outside of said main container.

28. The optical measuring apparatus of claim 22, wherein said measuring device is configured to receive laser light with a center wavelength in an inclusive range of 1300 nm through 1440 nm.

29. An optical measuring apparatus comprising:
a measuring device configured to receive and measure a characteristic of a laser light that is emitted from an output end of an optical fiber the input of which is connected to a laser device; and
a light path for said laser light being in a form of an optical fiber based optical element, said light path extending from an output end of said optical fiber to said measuring device.
sealing means for hermetically sealing an internal spatial propagation path of said measuring device with an amount of moisture limited to 100000 ppm by volume or less.

30. The optical measuring apparatus of claim 29, wherein said measuring device is configured to receive and measure a characteristic of a light with a center wavelength in an inclusive range of 1300 nm through 1440 nm.

* * * * *